United States Patent
Uemura et al.

(10) Patent No.: US 9,822,459 B2
(45) Date of Patent: Nov. 21, 2017

(54) CLAMPER AND HOLDING JIG INCLUDING SAME

(71) Applicant: C. UYEMURA & CO., LTD., Osaka-shi, Osaka (JP)

(72) Inventors: Tetsuro Uemura, Osaka (JP); Kouhei Kohama, Osaka (JP); Kazuya Miyoshi, Osaka (JP); Kahyeong Teoh, Osaka (JP)

(73) Assignee: C. Uyemura & Co., Ltd., Chuo-ku, Osaka-shi (JP)

( * ) Notice: Subject to any disclaimer, the term of this patent is extended or adjusted under 35 U.S.C. 154(b) by 488 days.

(21) Appl. No.: 14/453,811

(22) Filed: Aug. 7, 2014

(65) Prior Publication Data
US 2015/0042026 A1    Feb. 12, 2015

(30) Foreign Application Priority Data

Aug. 8, 2013   (JP) ................................. 2013-165089

(51) Int. Cl.
*C25D 17/08*    (2006.01)
*A45D 8/20*    (2006.01)
(Continued)

(52) U.S. Cl.
CPC ............... *C25D 17/08* (2013.01); *A45D 8/20* (2013.01); *H05K 3/241* (2013.01); *B25B 5/06* (2013.01);
(Continued)

(58) Field of Classification Search
CPC .... B25B 5/06; B25B 5/14; B25B 5/16; A45D 8/20; C25D 17/08; H05K 3/241;
(Continued)

(56) References Cited

U.S. PATENT DOCUMENTS 2,960,953 A * 11/1960 Schneider ............. B23K 3/087
269/1
3,362,052 A * 1/1968 Kozo ...................... A45D 8/20
132/277
(Continued)

FOREIGN PATENT DOCUMENTS

CN      1925225 A    3/2007
CN    101692758 A    4/2010
(Continued)

OTHER PUBLICATIONS

First Office Action dated Jun. 16, 2017, issued from the State Intellectual Property Office of People's Republic of China in corresponding Application No. 201410390185.1.
(Continued)

*Primary Examiner* — Larry E Waggle, Jr.
*Assistant Examiner* — Mahdi H Nejad
(74) *Attorney, Agent, or Firm* — Sughrue Mion, PLLC

(57) ABSTRACT

A clamper includes: a first clamping member having a first base portion and a first contact portion that is to be in contact with one surface of the workpiece; a second clamping member having a second contact portion that is to be in contact with the other surface of the workpiece; and a clamping member biasing member configured to bias at least one of the first clamping member and the second clamping member in a direction of bringing the first contact portion and the second contact portion closer to each other. The first contact portion has a plurality of plate spring portions extending from the first base portion, the plurality of plate spring portions configured to elastically deform independently from each other to come into contact with the workpiece.

13 Claims, 14 Drawing Sheets

(51) Int. Cl.
*H05K 3/24* (2006.01)
*B25B 5/06* (2006.01)
*D06F 55/00* (2006.01)

(52) U.S. Cl.
CPC ...... *D06F 55/00* (2013.01); *H05K 2203/1518* (2013.01); *H05K 2203/165* (2013.01)

(58) Field of Classification Search
CPC ..... H05K 2203/165; H05K 2203/1518; H05K 3/18; H05K 3/42; H05K 9/00; F16B 2/24; F16B 5/06; Y10T 24/307; Y10T 24/304; B60R 13/0206
USPC ....... 269/43, 161, 254 R, 238, 266, 26, 3, 6; 24/295, 293
See application file for complete search history.

(56) References Cited

U.S. PATENT DOCUMENTS

| | | | | |
|---|---|---|---|---|
| 3,434,686 | A * | 3/1969 | Aoi Yoshizaburo | A47L 13/512 211/45 |
| 3,640,519 | A * | 2/1972 | Halstead | H05K 13/0491 165/80.3 |
| 4,335,838 | A * | 6/1982 | Bisk | A47G 25/32 211/115 |
| 5,950,283 | A * | 9/1999 | Sato | B42F 1/006 24/67 R |
| 6,353,981 | B1 * | 3/2002 | Smith | F16B 2/241 24/289 |
| 7,188,392 | B2 * | 3/2007 | Giugliano | F16B 5/065 24/295 |
| 7,264,285 | B1 * | 9/2007 | Ross | E05B 13/002 24/67.3 |
| 8,220,827 | B2 * | 7/2012 | Schirm | B60R 21/216 24/289 |
| 2007/0064169 | A1 | 3/2007 | Miyazono | |
| 2008/0086850 | A1 * | 4/2008 | Smith | B60R 13/0206 24/289 |
| 2008/0271297 | A1 * | 11/2008 | Dubost | B60R 13/0206 24/293 |
| 2010/0139687 | A1 * | 6/2010 | Hsu | A45D 8/20 132/277 |
| 2011/0030719 | A1 * | 2/2011 | Yang | A45D 8/20 132/277 |
| 2013/0202350 | A1 * | 8/2013 | Kwon | F16B 5/0642 403/335 |
| 2013/0302087 | A1 * | 11/2013 | Binkert | F16B 2/243 403/335 |
| 2015/0026934 | A1 * | 1/2015 | Johnson | F16B 5/06 24/458 |
| 2016/0144801 | A1 * | 5/2016 | Huelke | B60N 3/026 24/295 |

FOREIGN PATENT DOCUMENTS

| | | | |
|---|---|---|---|
| JP | 02-33265 U | | 3/1990 |
| JP | H0233265 U | * | 3/1990 |
| JP | 5-74677 U | | 10/1993 |
| JP | 10-145030 A | | 5/1998 |
| JP | H10145030 | * | 5/1998 |
| JP | 2002-235178 A | | 8/2002 |
| JP | 2002235178 | * | 8/2002 |
| JP | 3348092 B2 | | 9/2002 |
| JP | 2006-100473 A | | 4/2006 |
| JP | 2006100473 | * | 4/2006 |
| JP | 3153550 U | | 8/2009 |
| JP | 3153551 U | | 8/2009 |
| JP | 4914780 B2 | | 1/2012 |
| JP | 2014198909 A1 | * | 10/2014 |

OTHER PUBLICATIONS

Notification of Reasons for Refusal dated Aug. 1, 2017, issued by the Japanese Patent Office in counterpart application No. 2013-165089.

* cited by examiner

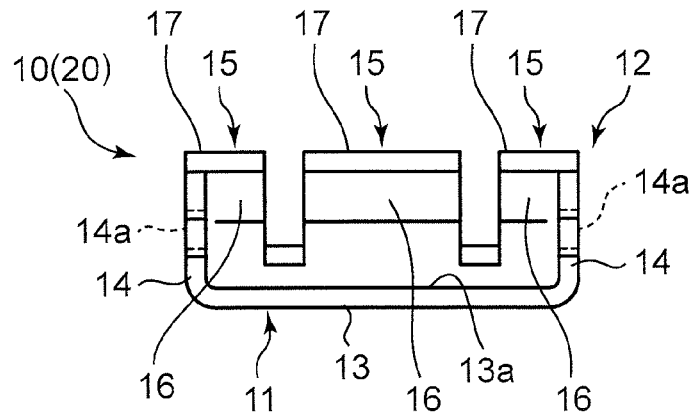
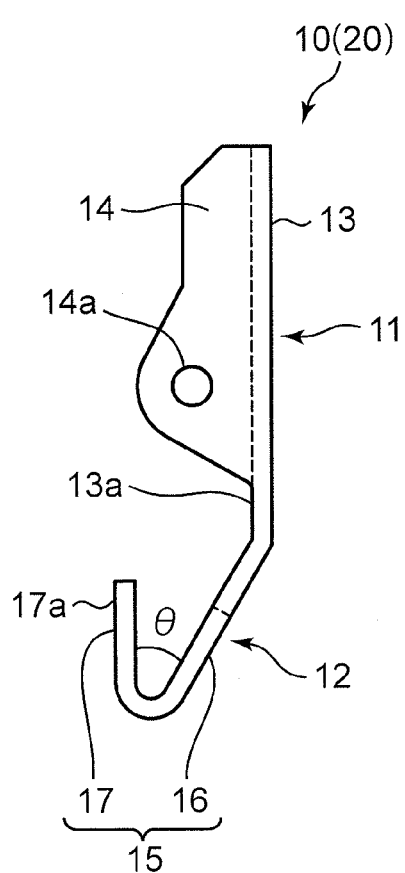
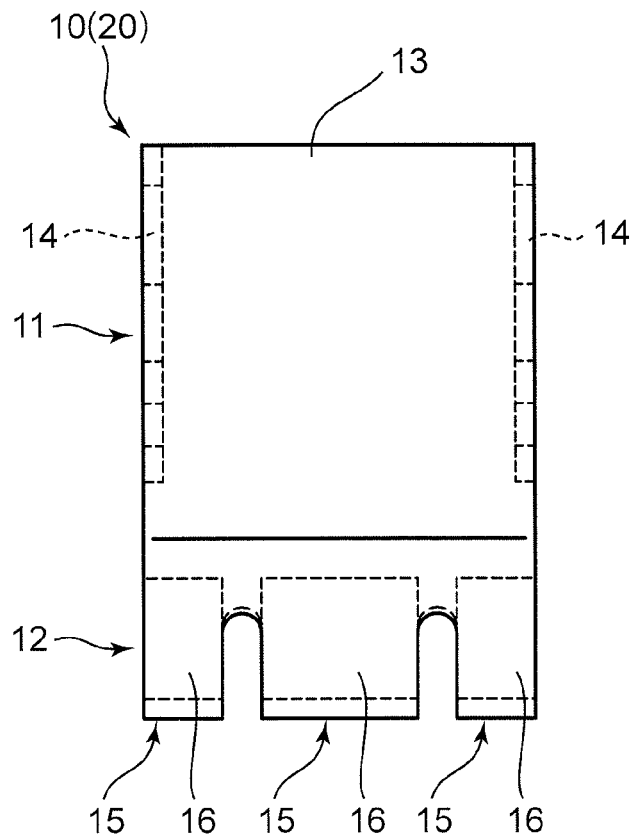

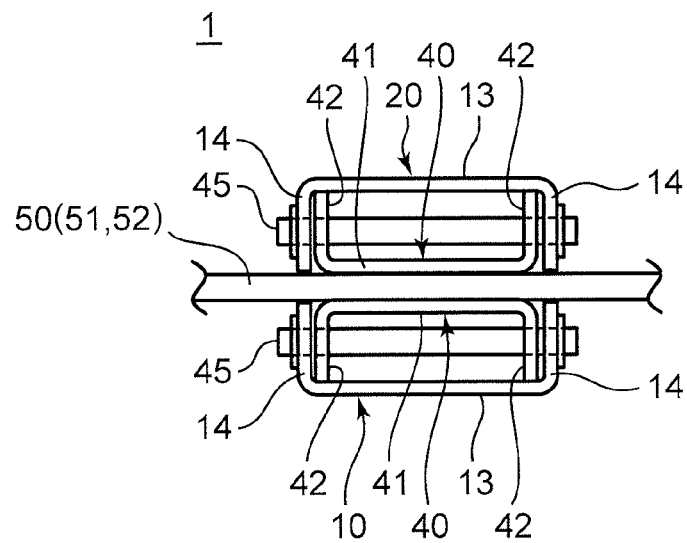
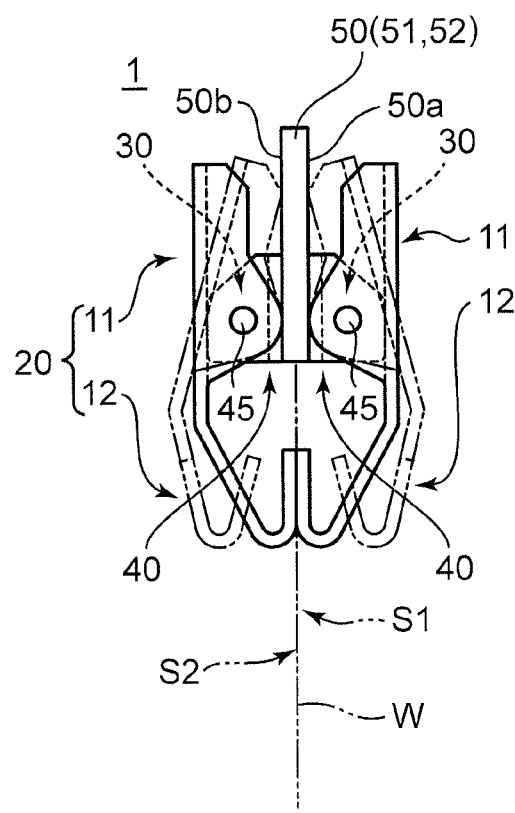
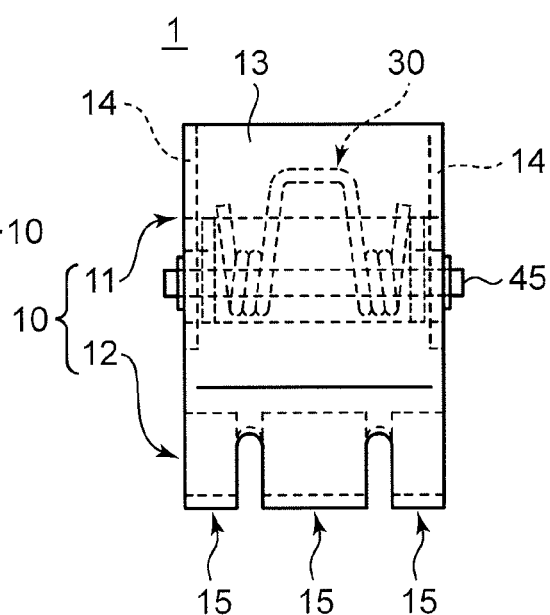
FIG. 3B
FIG. 3C
FIG. 3A

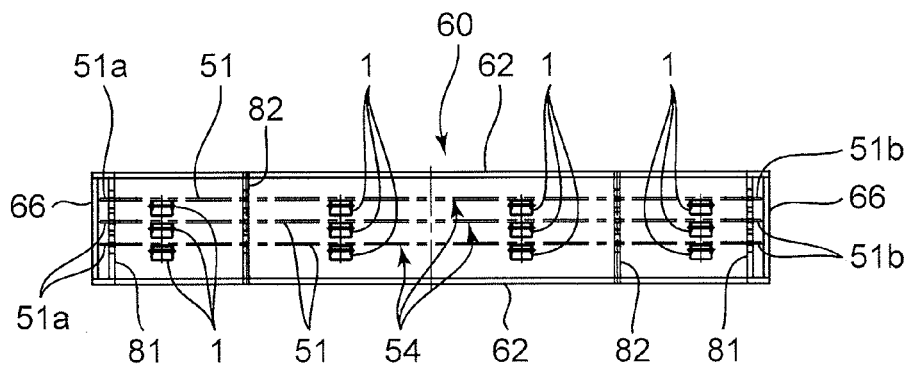
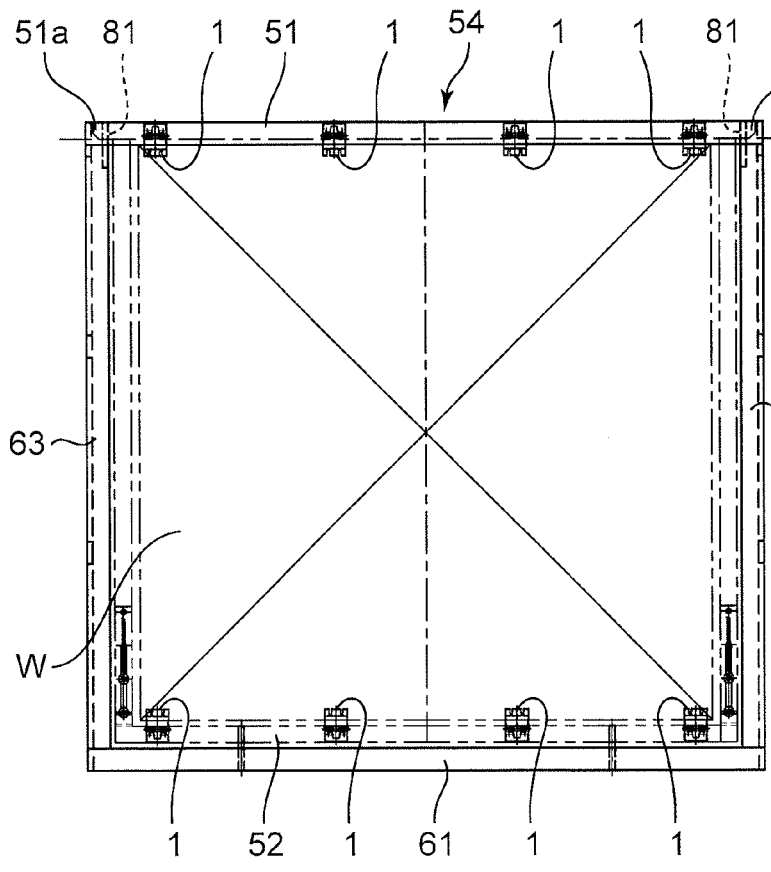
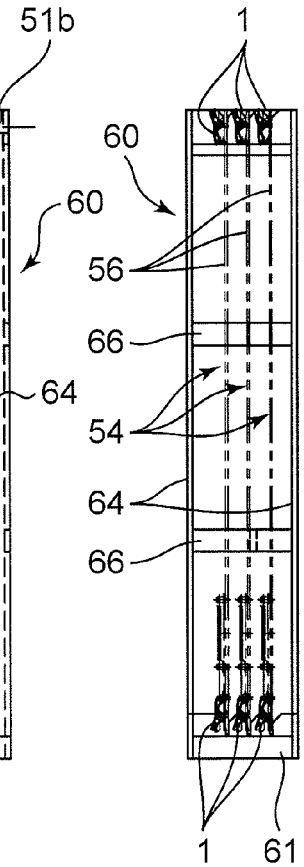

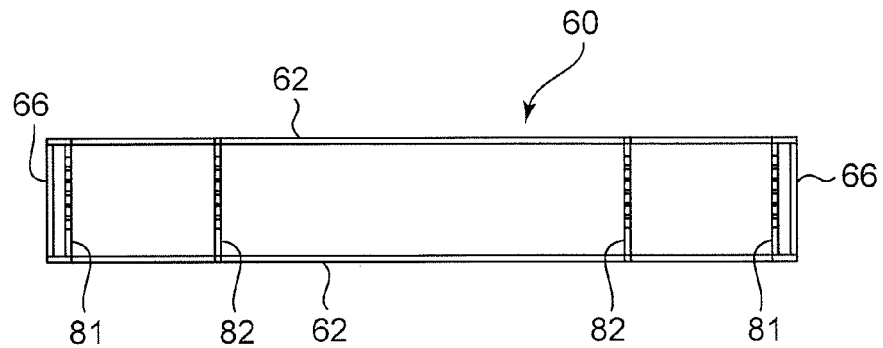
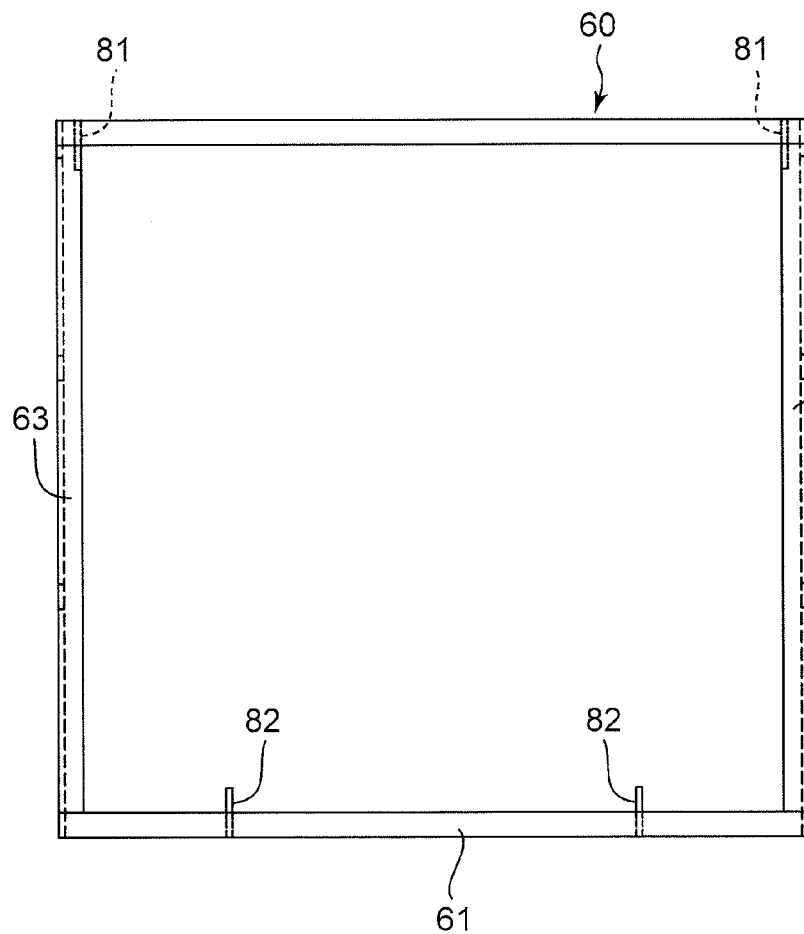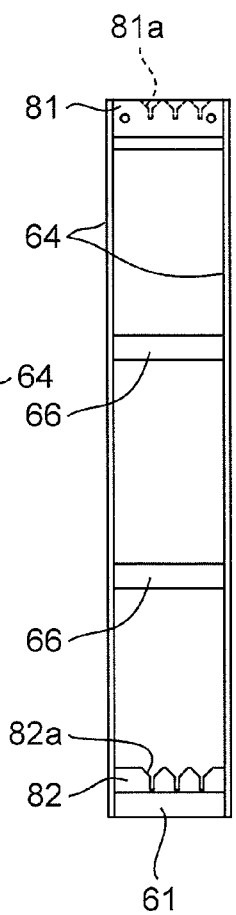

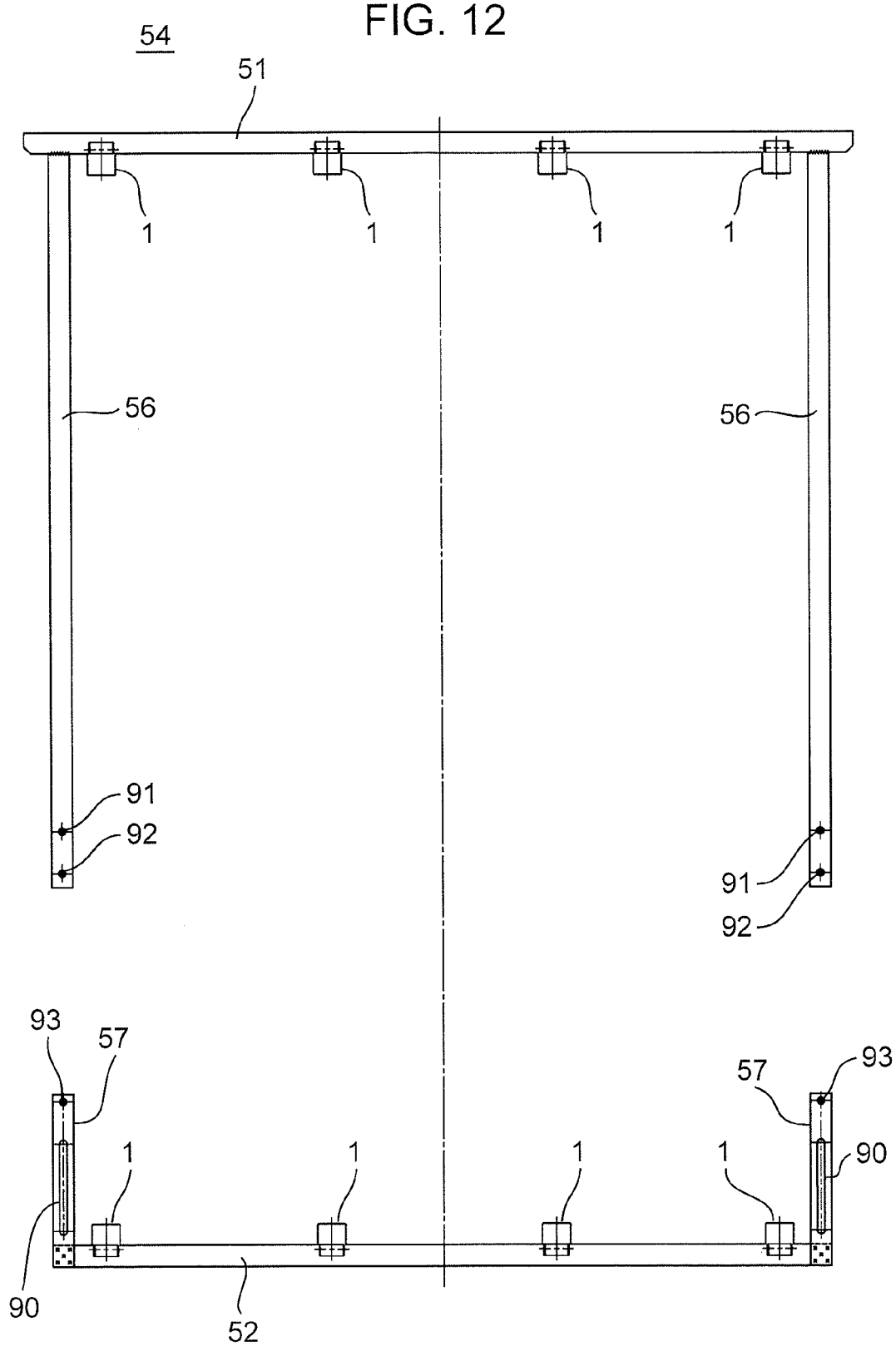

CLAMPER AND HOLDING JIG INCLUDING SAME

BACKGROUND OF THE INVENTION

Field of the Invention

The present invention relates to a clamper that clamps a plate-shaped workpiece when the workpiece is immersed in a surface treatment liquid such as a plating solution, and surface treatment such as plating is performed, and also to a holding jig including the clamper.

Description of the Related Art

Holding jigs (baskets) capable of holding plate-shaped workpieces, such as printed circuit boards and glass substrates, that are equidistantly arranged, are known. For example, in the basket disclosed in Japanese Patent No. 4,914,780, a workpiece holding space is formed by a support frame in the form of a rectangular parallelepiped. Side holding portions for holding workpieces are provided on the mutually opposing beam sections among the beam sections installed between the pillars of the support frame. The side holding portions are arranged equidistantly at the beam sections. A large number of workpieces can be equidistantly held by inserting the side portions (edges) of the workpieces between the side holding portions from above.

Further, Japanese Patent No. 3,348,092 and Japanese Utility Model Registration No. 3,153,550 disclose a holding jig that can hold thin flexible workpieces in a spread state. More specifically, the holding jig shown in FIGS. 1(a) and 1(b) of Japanese Patent No. 3,348,092 is provided with a conductive extension member biasing an auxiliary frame portion in the extension direction of the workpieces. The holding jig shown in FIG. 6 of Japanese Utility Model Registration No. 3,153,550 has a structure in which the lower end portion of a workpiece is pulled downward with biasing means.

Further, Japanese Utility Model Registration No. 3,153,551 and Japanese Utility Model Application Publication No. H5-74677 disclose a holding jig provided with a clamper that clamps a workpiece. More specifically, the clamper shown in FIGS. 3 and 4 of Japanese Utility Model Registration No. 3,153,551 is provided with a first clamper lever having a first clamping surface and a second clamper lever having a second clamping surface, and where a workpiece is clamped, the first clamping surface and the second clamping surface are brought into contact with the workpiece. The clamper shown in FIGS. 1(A) and 1(B) of Japanese Utility Model Application Publication No. H5-74677 is provided with a bent member in which clamping portions are curved surfaces.

With the conventional techniques, when the holding jig (basket) holding workpieces is immersed into a plating solution or pulled out therefrom, or under the effect of a liquid flow occurring during the immersion into the plating solution, the clamping positions of the workpieces can be shifted and the workpieces can be bent, and in some cases, the workpieces can be detached from the clampers. In such cases, the workpieces can be damaged or plating defects can occur.

SUMMARY OF THE INVENTION

It is an object of the present invention to provide a clamper in which the displacement of clamping positions of plate-shaped workpieces and the detachment of the workpieces from the clamper can be prevented, and also to provide a holding jig including the clamper.

The present invention provides a clamper that is provided at a holding jig used when immersing a plate-shaped workpiece into a surface treatment liquid, and that clamps the workpiece. The clamper includes a first clamping member, a second clamping member, and a clamping member biasing member. The first clamping member has a first base portion and a first contact portion that is to be in contact with one surface of the workpiece. The second clamping member has a second contact portion that is to be in contact with the other surface of the workpiece. The clamping member biasing member is configured to bias at least one of the first clamping member and the second clamping member in a direction of bringing the first contact portion and the second contact portion closer to each other. The first contact portion has a plurality of plate spring portions extending from the first base portion, and the plurality of the plate spring portions is configured to elastically deform independently from each other to come into contact with the workpiece.

BRIEF DESCRIPTION OF THE DRAWINGS

FIG. 2A is a front view of the clamping member, FIG. 2B is a plan view thereof, and FIG. 2C is a left side view thereof;

FIG. 3A is a front view of the clamper of the first embodiment, FIG. 3B is a plan view thereof, and FIG. 3C is a left side view thereof;

FIG. 10A is a front view of the holding jig of a vertical clamp system, FIG. 10B is a plan view thereof, and FIG. 10C is a side view thereof;

FIG. 11A is a front view of a support frame in the holding jig of a vertical clamp system, FIG. 11B is a plan view of the support frame, and FIG. 11C is a side view of the support frame;

FIG. 12 is a front view of an outer frame in the holding jig of a vertical clamp system;

DESCRIPTION OF THE EMBODIMENTS

A clamper 1 according to the embodiment of the present invention and holding jigs 101, 102 including the clamper 1 will be explained below in greater detail with reference to the appended drawings. The clamper 1 serves to clamp the edges of a plate-shaped workpiece W and hold the workpiece W in a stable posture. The clamper 1 is provided at the holding jigs 101, 102 that are used when the workpiece W is immersed in a surface treatment liquid. The holding jigs 101, 102 hold a plurality of the plate-shaped workpieces W at a distance from each other.

Examples of the surface treatment liquid include a plating solution, a pretreatment solution, a post-treatment solution, a desmearing solution, a cleaning solution, a catalyst imparting solution, an etching solution, an activation solution, and a reducing solution. The case in which the surface treatment liquid is a plating solution is explained by way of example, but this example is not limiting. The surface treatment liquid also may be any of the above-mentioned liquids other than the plating solution.

Clamper

First Embodiment

Figure 1:
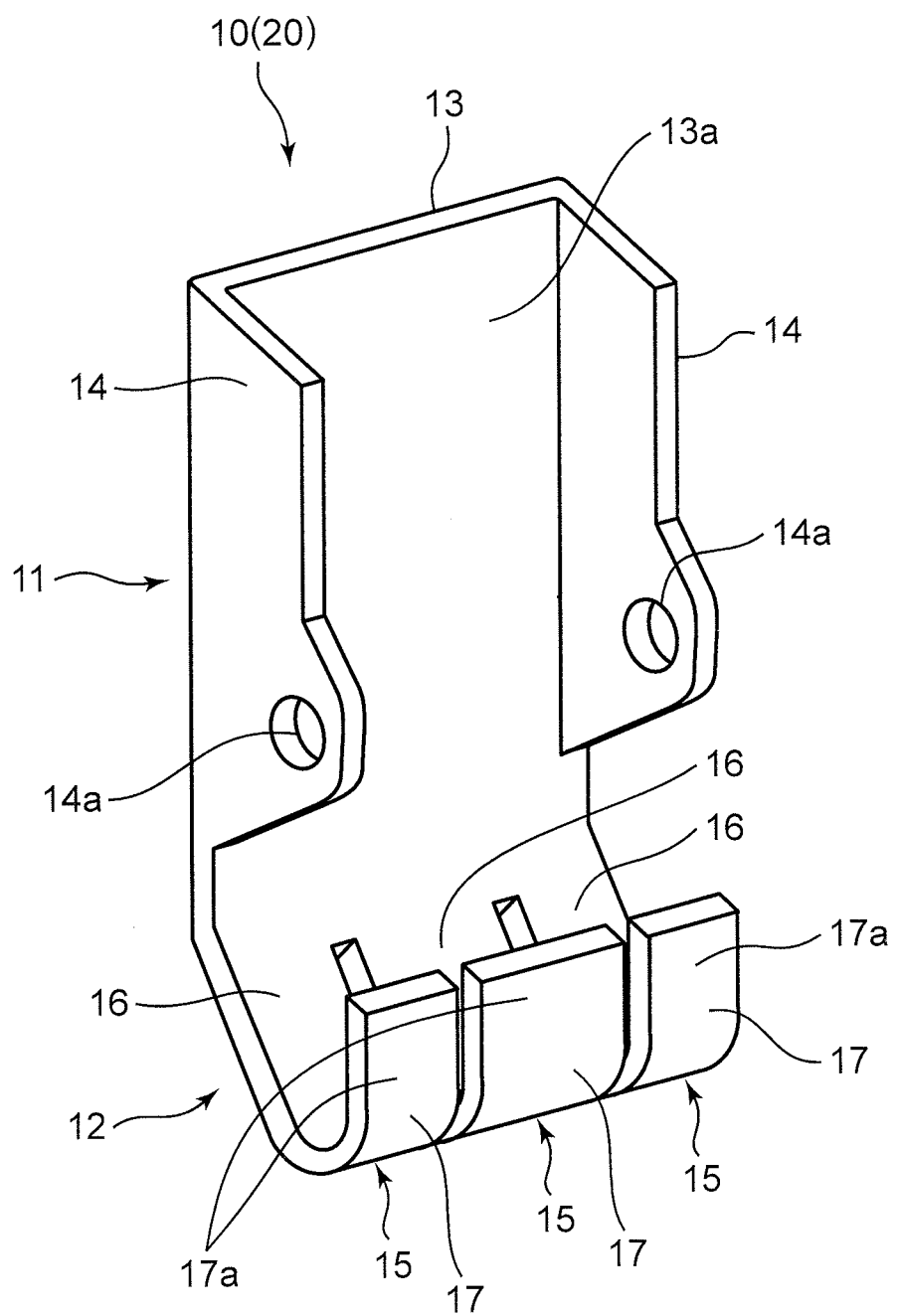
FIG. 1 is a perspective view of clamping member of the clamper according to the first embodiment of the present invention.
Figure 4A:
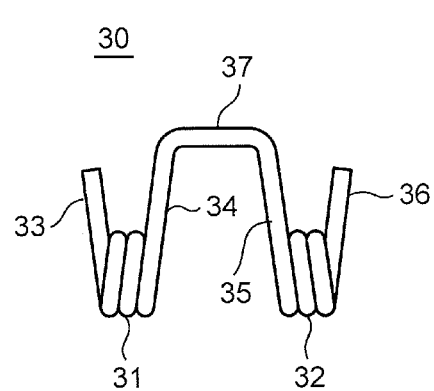
FIG. 4A is a front view of a clamping member biasing member of the clamper.
Figure 4B:
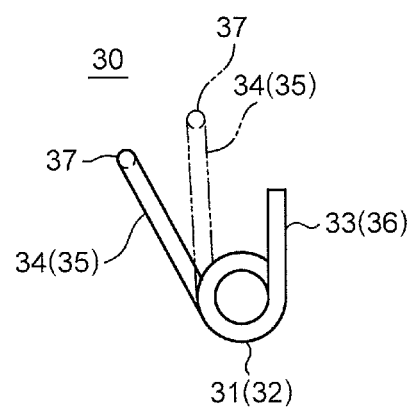
FIG. 4B is a side view thereof.

FIG. 1 is a perspective view of a first clamping member 10 and a second clamping member 20 of the clamper 1 according to the first embodiment of the present invention. FIG. 2A is a front view of the first clamping member 10 and the second clamping member 20. FIG. 2B is a plan view thereof. FIG. 2C is a left side view thereof. FIG. 3A is a front view of the clamper 1 of the first embodiment. FIG. 3B is a plan view thereof. FIG. 3C is a left side view thereof. FIG. 4A is a front view of a clamping member biasing member 30 of the clamper 1. FIG. 4B is a side view thereof.

The clamper 1 according to the present embodiment is provided with the first clamping member 10, the second clamping member 20, a pair of the clamping member biasing member 30, a pair of support members 40, and a pair of connection shafts 45.

As shown in FIGS. 3B and 3C, the clamper 1 is supported, for example, at a holding member 50. A plurality of the clampers 1 is mounted on the holding member 50. Examples of the holding member 50 include a plate-shaped member and a rod-shaped member. When a plurality of the clampers 1 is arranged at a distance from each other in one direction, it is preferred that the holding member 50 has a shape elongated in the one direction. For example, a first holding member 51 or a second holding member 52 of the below-described holding jigs 101, 102 can be used as the holding member 50.

In the first embodiment shown in FIGS. 3B and 3C, the first clamping member 10 is provided on one main surface 50a side of the plate-shaped holding member 50, and the second clamping member 20 is provided on the other main surface 50b side of the holding member 50. In the present embodiment, the first clamping member 10 is supported on the main surface 50a of the holding member 50 by the support member 40 and the connection shaft 45, and the second clamping member 20 is supported on the main surface 50b of the holding member 50 by the support member 40 and the connection shaft 45.

Figure 5B:
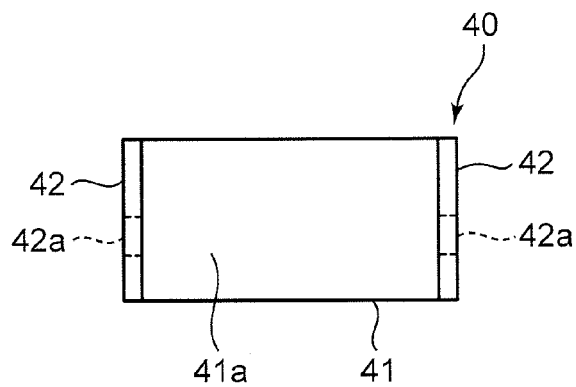
FIG. 5B is a rear view thereof.
Figure 5A:
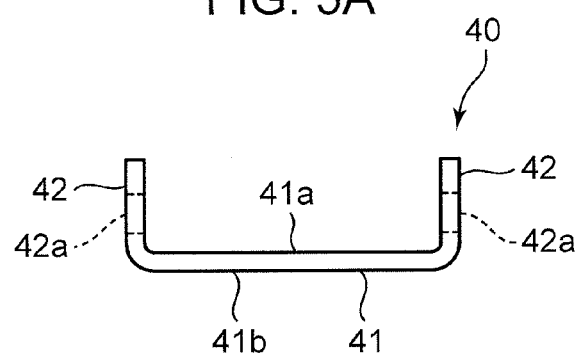
FIG. 5A is a plan view of the support member of the clamper.
Figure 5C:
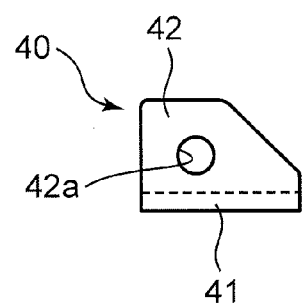
FIG. 5C is a side view thereof.
Figure 5D:
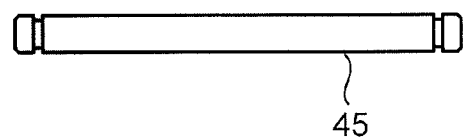
FIG. 5D is a front view showing the connection shaft connecting the clamping member to the support member.

FIG. 5A is a plan view of the support member 40 of the clamper 1. FIG. 5B is a rear view thereof. FIG. 5C is a side view thereof. FIG. 5D is a front view showing the connection shaft 45 connecting the clamping members 10, 20 to the support member 40. As shown in FIGS. 5A, 5B, and 5C, the support member 40 has a plate-shaped main wall 41, and a pair of side walls 42, rising in the same direction from both sides of the main wall 41. One main surface 41a of the main wall 41 is an opposing surface 41a facing the first clamping member 10 or the second clamping member 20. The other main surface 41b of the main wall 41 is a joining surface 41b that is to be joined to the main surface 50a or main surface 50b of the holding member 50. The joining surface 41b of the main wall 41 is joined to the main surface 50a or the main surface 50b of the holding member 50 by joining means, for example, such as welding. A through hole 42a for inserting the connection shaft 45, such as shown in FIG. 5D, is provided in each of the pair of side walls 42.

The first clamping member 10 and the second clamping member 20 have a function of cooperatively clamping the workpiece W. The first clamping member 10 and the second clamping member 20 are configured to be capable of moving relative to each other in the direction of clamping the edges of the workpiece W and the direction of separating from the workpiece W. In the present embodiment, one clamping member biasing member 30 biases the first clamping member 10, and the other clamping member biasing member 30 biases the second clamping member 20. However, a configuration in which the first clamping member 10 and the second clamping member 20 are biased by one clamping member biasing member 30 may be also used.

As shown in FIGS. 3A, 3B and 3C, in the first embodiment, the second clamping member 20 has the same structure as the first clamping member 10. Therefore, In FIGS. 1 to 3, the reference numerals relating to the detailed structure of the first clamping member 10 and the second clamping member 20 are the same. As indicated in the below-described second embodiment, the second clamping member 20 may also have a structure different from that of the first clamping member 10.

As shown in FIGS. 1, 2A, 2B, and 2C, the first clamping member 10 has a base portion 11 (first base portion 11) and a contact portion 12 (first contact portion 12). Likewise, the second clamping member 20 has a base portion 11 (second base portion 11) and a contact portion 12 (second contact portion 12).

The base portion 11 has a function of connecting the first clamping member 10 and the second clamping member 20. The base portion 11 also has a function of causing the first contact portion 12 and the second contact portion 12 to move in the direction of approaching each other by receiving the biasing force from the clamping member biasing member 30. The base portion 11 has a function of supporting the contact portion 12.

The base portion 11 has a plate-shaped main wall 13 and a pair of side walls 14, rising in the same direction from both sides of the main wall 13. One main surface 13a of the main wall 13 is an opposing surface 13a facing the main surface 41a of the main wall 41 of the support member 40. A through hole 14a for inserting the connection shaft 45 is provided in the pair of side walls 14. As shown in FIGS. 3A, 3B, and 3C, the connection shaft 45 is inserted into the through holes 14a, 42a in a state in which the through hole 14a of the base portion 11 and the through hole 42a of the support member 40 are arranged on the same axis. As a result, the first clamping member 10 (second clamping member 20) is supported on the holding member 50 (support member 40) rotatably about the connection shaft 45 with respect to the holding member 50 (support member 40).

The clamping member biasing member 30 is disposed in a space between the base portion 11 and the support member 40. In the present embodiment, the clamping member biasing member 30 is a torsion spring (coil spring) such as shown in FIGS. 4A and 4B. The torsion spring 30 is supported by the connection shaft 45 as a result of the connection shaft 45 being inserted therein.

Any clamping member biasing member 30 may be used, provided that the first clamping member 10 and the second clamping member 20 can be biased, and a biasing member other than the spring may be used. Further, in the first embodiment, the clamping member biasing member 30 is a torsion spring, but such a configuration is not limiting, and other biasing member, for example, a plate spring, may be also used.

The torsion spring 30 shown in FIGS. 4A and 4B has a structure in which a plurality of coils 31, 32 is connected, but such a configuration is not limiting. Thus, the torsion spring 30 may have only one coil 31. One end portion 33 of the first coil 31 and one end portion 36 of the second coil 32 of the torsion spring 30 are disposed, for example, such as to be in contact with either of the main surface 13a and the main surface 41a, and the other end portion 34 of the first coil 31 and the other end portion 35 of the second coil 32 of the torsion spring 30 are disposed to be in contact, for example, with the other of the main surface 13a and the main surface 41a. As a result, the torsion spring 30 can bias the base portion 11 and the support member 40 in the direction of separating from each other. Thus, the base portion 11 is biased in the direction of widening outwardly. Therefore, the contact portion 12 positioned on the opposite side of the base portion 11 with respect to the connection shaft 45 is biased inward. As a result, the first contact portion 12 and the second contact portion 12 are biased in the direction of approaching each other. In the present embodiment, the other end portion 34 of the first coil 31 and the other end portion 35 of the second coil 32 are connected by a connection portion 37, but such a configuration is not limiting, and those end portions may be not connected to each other.

In FIG. 4B, the other end portion 34 of the first coil 31 and the other end portion 35 of the second coil 32, which are shown by solid lines, are shown in a state in which the first contact portion 12 and the second contact portion 12 are brought close to each other, as shown by solid lines in FIG. 3C, that is, in a state after the workpiece W has been clamped. In FIG. 4B, the other end portion 34 of the first coil 31 and the other end portion 35 of the second coil 32, which are shown by two-dot-dash lines, are shown in a state in which the first contact portion 12 and the second contact portion 12 separate from each other, as shown by two-dot-dash lines in FIG. 3C, that is, in a state before the workpiece W is clamped.

The first contact portion 12 of the first clamping member 10 and the second contact portion 12 of the second clamping member 20 have a function of clamping and holding the workpiece W. As shown in FIG. 3C, the first contact portion 12 is in contact with one surface S1 of the workpiece W, and the second contact portion 22 is in contact with the other surface-S2 of the workpiece W.

Each contact portion 12 has a plurality of plate spring portions 15 (three plate spring portions 15 in the present embodiment) extending from the base portion 11. The plurality of the plate spring portion 15 extends in the same direction. The plurality of the plate spring portions 15 elastically deforms independently from each other to come into contact with the workpiece W.

As shown in FIGS. 1 to 3, the plurality of plate spring portions 15 is provided at a distance from each other. In the embodiment shown in FIGS. 1 to 3, the width of the plate spring portions 15 at both sides is less than that of the plate spring portion 15 positioned therebetween, but such a configuration is not limiting.

Each plate spring portion 15 includes an extending portion 16 extending from the base portion 11, and a turnback portion 17 bent at the end of the extending portion 16. The turnback portion 17 has a contact surface 17a that is to be in contact with the workpiece W. Each plate spring portion 15 has a bent shape, such as a substantially U-like shape and a substantially V-like shape, in the side view shown in FIG. 2C. As shown in FIG. 3C, the first clamping member 10 and the second clamping member 20 are disposed such that the turnback portion 17 of the first clamping member 10 and the turnback portion 17 of the second clamping member 20 face each other.

The extending portion 16 extends in the direction of separating from the main wall 13 of the base portion 11. The extending portion 16 extends in a direction forming an obtuse angle with the main surface 13. Thus, the extension direction of the extending portion 16 is inclined inward (workpiece W side) with respect to the extension direction of the main wall 13.

The turnback portion 17 extends from the end portion of the extending portion 16 in the direction of approaching the base portion 11. The bending angle θ (see FIG. 2C) of the turnback portion 17 with respect to the extending portion 16 is preferably adjusted such that the contact surface 17a comes into surface contact with the workpiece W. In the present embodiment, the turnback portion 17 is substantially parallel to the main wall 13, but such a configuration is not limiting.

Second Embodiment

Figure 6B:
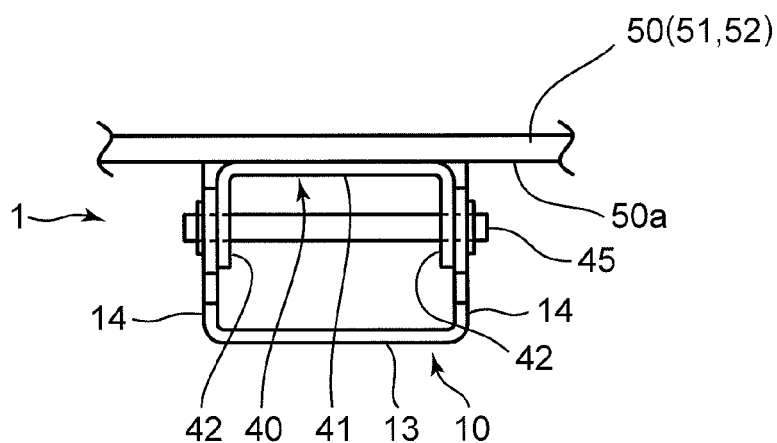
FIG. 6B is a plan view thereof.
Figure 6A:
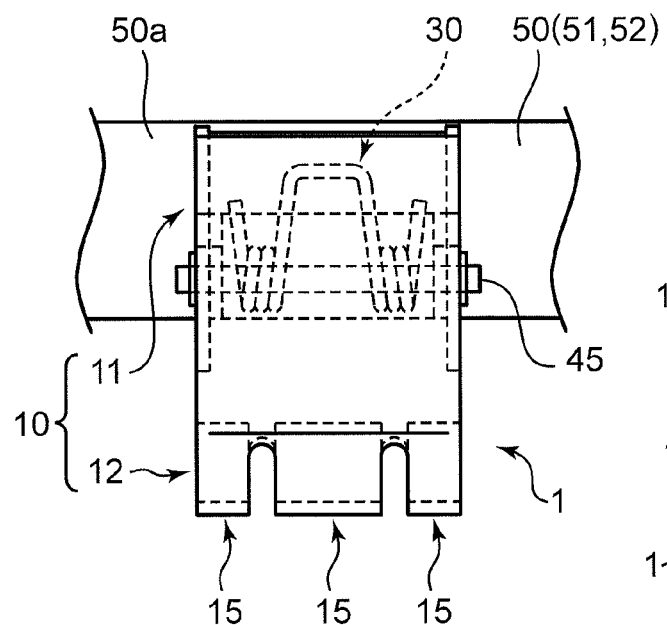
FIG. 6A is a front view of the clamper of the second embodiment.
Figure 6C:
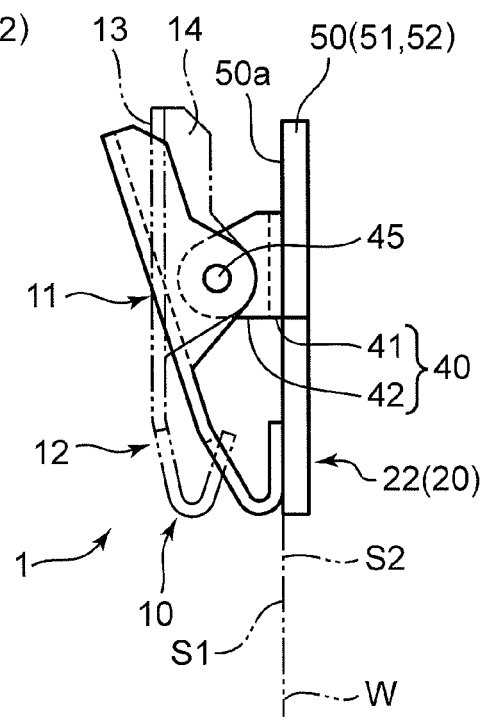
FIG. 6C is a right side view thereof.

FIG. 6A is a front view of the clamper 1 of the second embodiment. FIG. 6B is a plan view thereof. FIG. 6C is a right side view thereof. As shown in FIGS. 6A, 6B, and 6C, the structure of the second clamping member 20 in the clamper 1 of the second embodiment is different from that of the first embodiment. In the second embodiment, the first clamping member 10 is the same as in the first embodiment, and the detailed explanation thereof is herein omitted.

The second clamping member 20 has a second contact portion 22 that is in contact with the other surface S2 of the workpiece W. The first contact portion 12 can move in the direction of approaching the second contact portion 22 and in the direction of separating therefrom. In the present embodiment, the second contact portion 22 is in a substantially stationary state, and the first contact portion 12 moves in the direction of approaching the second contact portion 22 and in the direction of separating therefrom.

The second contact portion 22 of the second clamping member 20 does not have the plate spring portion 15 such as that of the first contact portion 12 of the first clamping member 10. In the second embodiment shown in FIGS. 6A, 6B, and 6C, the second contact portion 22 has a flat plate shape. As shown in FIG. 6C, the second contact portion 22 is connected, for example, to the lower end portion of the holding member 50, but such a configuration is not limiting.

In the second embodiment, the shape of one clamping member (second clamping member 20) of the clamper 1 can be simplified. Therefore, the cost of the clamper can be reduced.

[Holding Jig]

The holding jigs 101, 102 according to an embodiment of the present invention will be explained below. The clamper 1 according to the above-described first embodiment and the clamper 1 according to the second embodiment can be used as the clamper 1 to be used in the holding jigs 101, 102, but the clampers 1 of those embodiments are not limiting and other clampers 1 can be also used.

(Holding Jig of Lateral Side Clamping System)

Figure 7:
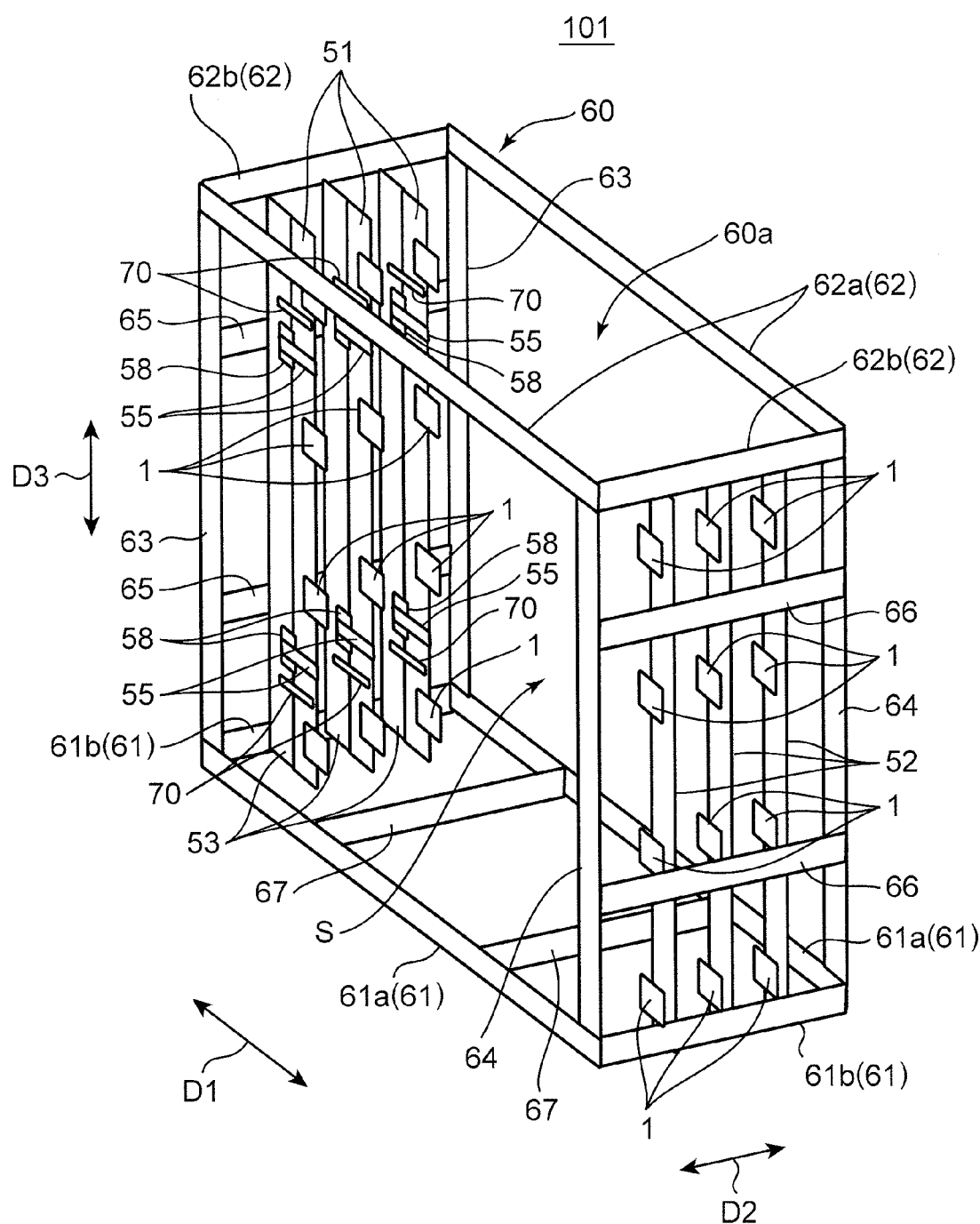
FIG. 7 is a perspective view of the holding jig of a lateral side clamping system according to the embodiment of the present invention.
Figure 8B:
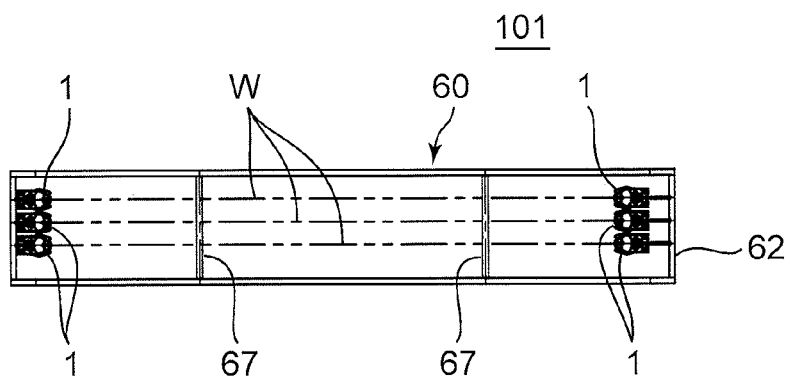
FIG. 8B is a plan view thereof.
Figure 8A:
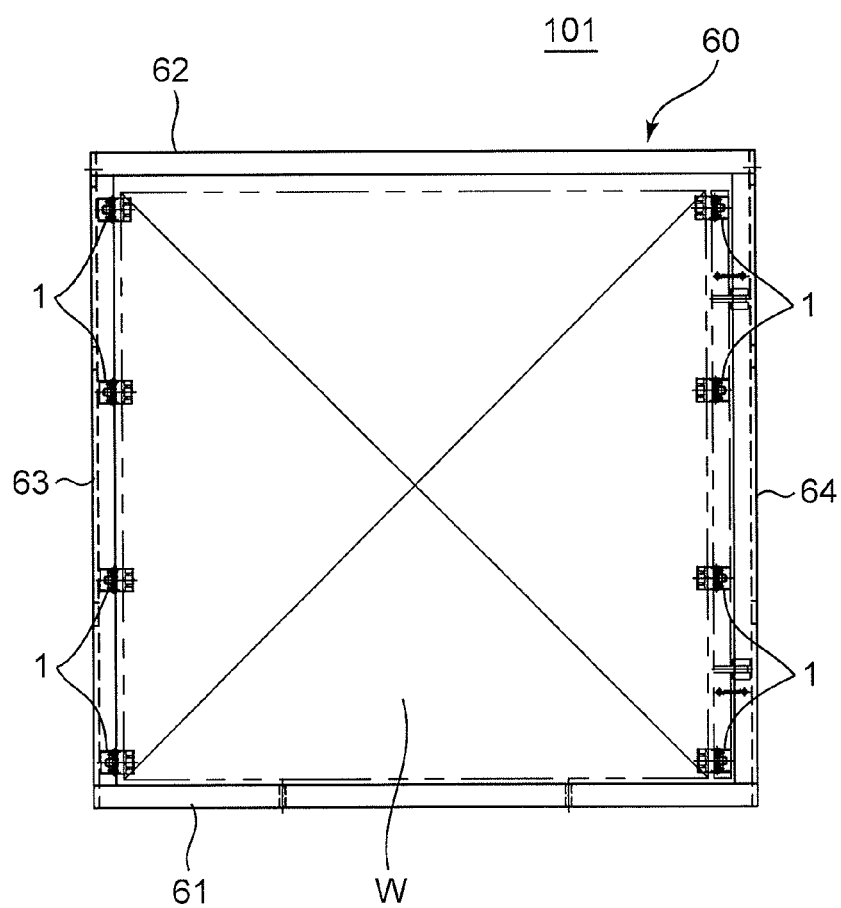
FIG. 8A is a front view of the holding jig of a lateral side clamping system.
Figure 8C:
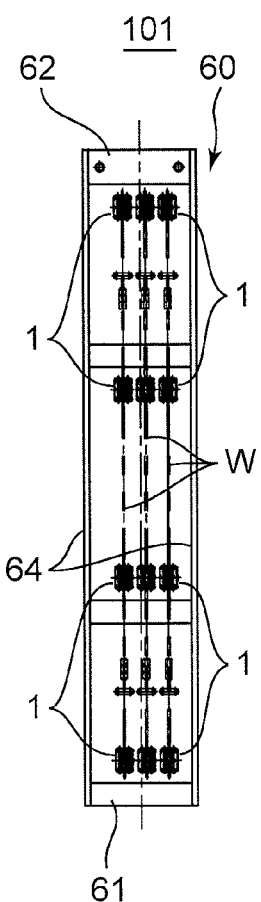
FIG. 8C is a side view thereof.

First, the holding jig 101 of a lateral side clamping system according to the embodiment of the present invention will be explained. FIG. 7 is a perspective view of the holding jig of a lateral side clamping system according to the embodiment of the present invention. FIG. 8A is a front view of the holding jig 101 of a lateral side clamping system. FIG. 8B is a plan view thereof. FIG. 8C is a side view thereof.

As shown in FIGS. 7, 8A, 8B, and 8C, the holding jig (basket) 101 of a lateral side clamping system serves to hold a plurality of the plate-shaped workpiece W at a distance from each other. The holding jig 101 is provided with a plurality of the above-described clampers 1, a plurality of first holding members 51, a plurality of second holding members 52, a plurality of fixed members 53, a support frame 60, and a plurality of holding member biasing members 70.

The support frame 60 forms a space S for arranging a plurality of the workpieces W at a distance from each other in a state in which the workpieces are held by the first holding member 51 and the second holding member 52. The support frame 60 is configured by assembling a plurality of frame members in a rectangular parallelepiped form, and the rectangular parallelepiped space S is formed inside the support frame 60. The space S is formed to a size corresponding to the size of the workpiece W, such as a printed circuit board, and such that a large number of the workpieces W can be arranged in the thickness direction. When the workpiece W is a printed circuit board, it has a rectangular shape. The printed circuit boards are arranged in the space in the thickness direction thereof. Accordingly, the space inside the support frame 60 is in a rectangular parallelepiped shape. The upper side of the support frame 60 is open. The upper side of the support frame 60 serves as an insertion port 60a for the workpieces W. As a result, the workpieces W can be inserted and pulled out through the insertion port 60a of the support frame 60. More specifically, automatic loading and automatic unloading can be performed.

The frame members includes a lower frame 61 assembled in a rectangular shape, an upper frame 62 assembled in a rectangular shape above the lower frame 61, a pair of side frames 63 connecting one side (for example, left side) of the lower frame 61 to the corresponding side of the upper frame 62, and a pair of side frames 64 connecting the other side (for example, right side) of the lower frame 61 to the corresponding side of the upper frame 62. The side frames extend in the up-down direction.

The lower frame 61 includes a pair of long frames 61a extending from the one side to the other side, and a pair of short frames 61b. One short frame 61b connects together the end portions of the long frames 61a on the one side, and the other short frame 61b connects together the end portions of the long frames 61a on the other side.

The upper frame 62 includes a pair of long frames 62a extending from the one side to the other side, and a pair of short frames 62b. One short frame 62b connects together the end portions of the long frames 62a on the one side, and the other short frame 62b connects together the end portions of the long frames 62a on the other side.

Reinforcing frames 65 connect the pair of side frames 63. Reinforcing frames 66 connect the pair of side frames 64. Further, reinforcing frames 67 connect together the opposing frames in the lower frame 61.

A plurality (three in the present embodiment) of fixed members 53 is provided on one lateral side of the support frame 60. Thus, the plurality of the fixed members 53 is provided at one side in the extension direction D1 of the long frames 61a, 62a in the support frame 60. More specifically, each fixed member 53 is a plate-shaped frame extending in an up-down direction D3, and the plurality of the fixed members 53 is arranged at a distance from each other along the extension direction D2 of the short frames 61b, 62b on the one side. The fixed members 53 are fixed to the support frame 60 on the one side.

A plurality (three in the present embodiment) of first holding members 51 is provided on the one lateral side of the support frame 60. More specifically, each first holding member 51 is a plate-shaped frame extending in the up-down direction D3, and is disposed at a position adjacent to the corresponding fixed member 53. Each first holding member 51 is provided on the second holding member 52 side with respect to the corresponding fixed member 53.

A plurality (three in the present embodiment) of second holding members 52 is provided on the other lateral side of the support frame 60. More specifically, each second holding member 52 is a plate-shaped frame extending in the up-down direction D3. The plurality of the second holding members 52 is arranged at a distance from each other along the extension direction D2 of the short frames 61b, 62b on the other side. The second holding members 52 are fixed to the support frame 60 on the other side.

A plurality of the clampers 1 is held in the first holding members 51. The plurality of the clampers 1 is arranged at a distance from each other in the up-down direction in the first holding members 51. The plurality of the clampers 1 is held in the second holding members 52. The plurality of the clampers 1 is arranged at a distance from each other in the up-down direction in the second holding members 52. One side edge (for example, the left edge) of each workpiece W is clamped by the plurality of the clampers 1 provided at the first holding member 51, and the other edge (for example, the right edge) of each workpiece W is clamped by the plurality of the clampers 1 provided at the second holding member 52. As a result, as shown in FIGS. 8A, 8B, and 8C, a plurality of workpieces W is stably held in the space S of the support frame 60.

A specific example of the attachment method is described below. First, the plurality of the clampers 1 provided at the second holding members 52 is attached to the edge on the other lateral side of the workpiece W. Then, when the clampers 1 are attached to the edge on the one lateral side of the workpiece W, the first holding member 51 is moved in the direction of separating the first holding member 51 from the fixed member 53 (direction of bringing the first holding member 51 closer to the workpiece W) against the biasing force of the holding member biasing member 70, and in this state the plurality of the clampers 1 provided at the first holding member 51 is attached to the edge on the one lateral side of the workpiece W.

Each first holding member 51 is biased by at least one holding member biasing member 70 in the direction of approaching the corresponding fixed member 53. In other words, the holding member biasing member 70 biases the first holding member 51 in the horizontal direction of separation between the first holding member 51 and the second holding member 52. In the present embodiment, the holding member biasing member 70 is a torsion spring, but such a configuration is not limiting. One end portion of the holding member biasing member 70 is fixed to the fixed member 53, and the other end portion of the holding member biasing member 70 is fixed to the first holding member 51.

In the present embodiment, the fixed member 53 has one or a plurality of guide portions 58 extending in the horizontal direction. In the present embodiment, the guide portion 58 has a groove shape extending in the horizontal direction toward the second holding member 52 side. The first holding member 51 has one or a plurality of engagement portions 55 that extends in the horizontal direction and engages with the guide portion 58. In the present embodiment, the engagement portion 55 has a rod-like shape (rail-like shape) extending in the horizontal direction toward the fixed member 53 side. As a result, the first holding member 51 can move stably in the horizontal direction along the guide portion 58 with respect to the fixed member 53.

By providing the above-described configuration, it is possible to hold a plurality of workpieces W in a state of extension in the space S of the support frame 60, as shown in FIGS. 8A, 8B, and 8C.

Further, in the present embodiment, when the workpieces W are inserted into the space S of the support frame 60, the support frame 60 is preferably disposed in a posture such that the insertion port 60a is positioned above the space S, as shown in FIG. 7, and when the plurality of the workpieces W disposed in the space S is immersed into the plating solution (not shown in the figure), the support frame 60 is preferably positioned in a posture rotated through 90 degrees, that is, in a posture such that the insertion port 60a is at the side of the space and the first holding member 51 is positioned below the second holding member 52. However, it is not always necessary to rotate the support frame through 90 degrees when immersing into the plating solution, and the support frame 60 may be immersed into the plating solution in a posture such that the insertion port 60a is positioned above the space S.

Further, in the present embodiment, the holding member biasing member 70 is provided only on one lateral side of the support frame 60, but such a configuration is not limiting. Thus, the holding member biasing member 70 may be provided at both lateral sides of the support frame 60.

(Holding Jig of a Vertical Clamping System)

Figure 9:
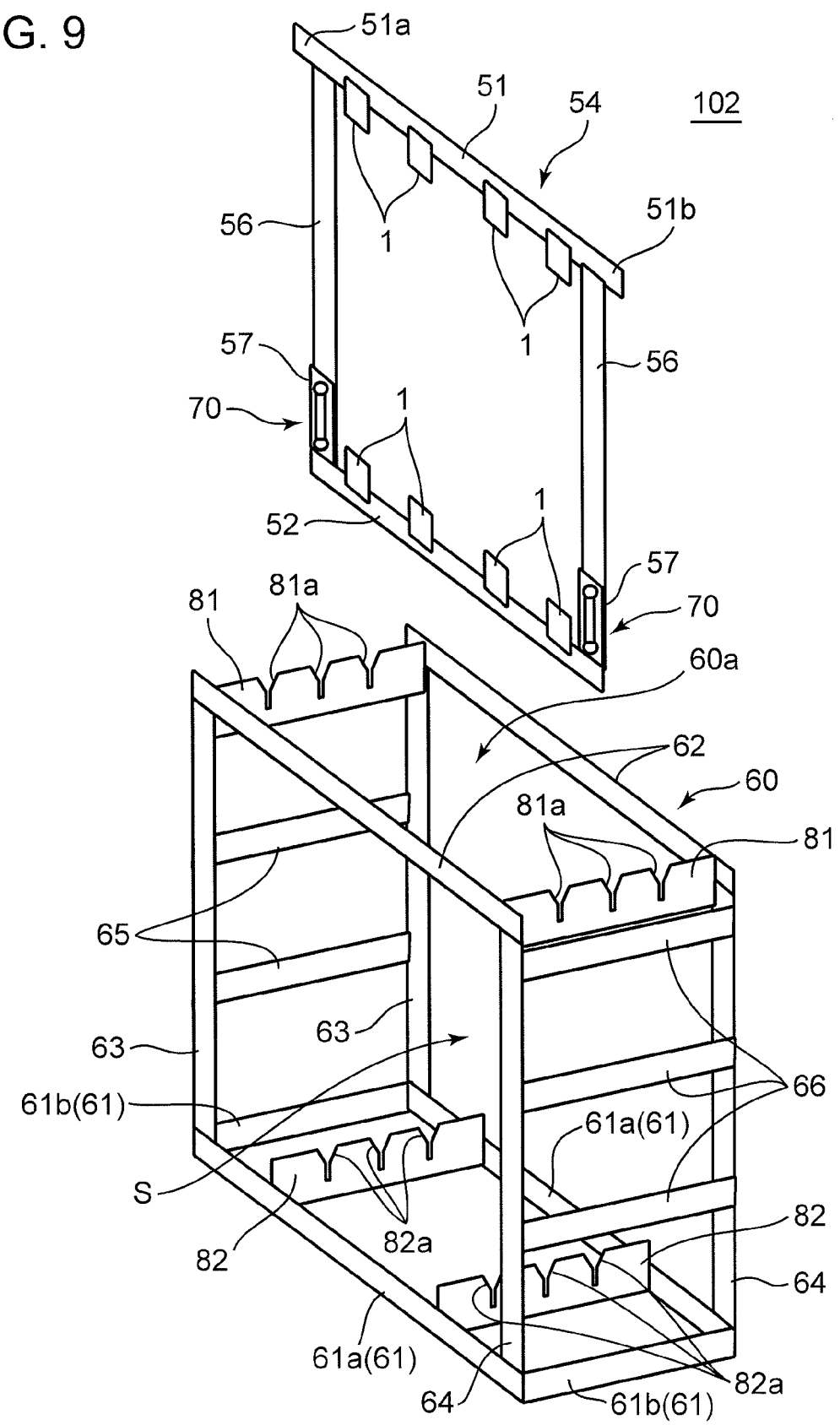
FIG. 9 is a perspective view of the holding jig of a vertical clamp system according to the embodiment of the present invention.

A holding jig 102 of a vertical clamping system according to an embodiment of the present invention will be explained below. FIG. 9 is a perspective view of the holding jig 102 of a vertical clamping system according to an embodiment of the present invention. FIG. 10A is a front view of the holding jig 102 of a vertical clamping system. FIG. 10B is a plan view thereof. FIG. 10C is a side view thereof. FIG. 11A is a front view of a support frame 60 in the holding jig 102 of a vertical clamping system. FIG. 11B is a plan view of the support frame 60. FIG. 11C is a side view of the support frame 60. FIG. 12 is a front view of an outer frame 54 in the holding jig 102 of a vertical clamping system.

As shown in FIGS. 9, 10A, 10B, and 10C, the holding jig (basket) 102 of a vertical clamping system serves to hold a plurality of plate-shaped workpieces W at a distance from each other. The holding jig 102 is provided with the above-described plurality of the clampers 1, a plurality of the first holding members 51, a plurality of the second holding members 52, the support frame 60, and a plurality of the holding member biasing members 70. The holding jig 102 of a vertical clamping system differs from the holding jig 101 of a lateral side clamping system in that the first holding member 51 and the second holding member 52 constitute part of the outer frame 54 separate from the support frame 60.

As shown in FIG. 12, the outer frame 54 includes the first holding member 51 (upper frame member 51), the second holding member 52 (lower frame member 52) provided below the first holding member 51 at a distance therefrom, a pair of upper vertical frame members 56, and a pair of lower vertical frame members 57. The pair of upper vertical frame members 56 is connected to both sides of the first holding member 51 and extends downward. The pair of lower vertical frame members 57 is connected to both sides of the second holding member 52 and extends upward. In the present embodiment, the length of the upper vertical frame member 56 is larger than that of the lower vertical frame members 57, but such a configuration is not limiting. Thus, the length of the upper vertical frame member 56 may be less than the length of the lower vertical frame member 57 or equal to the length of the lower vertical frame member 57. The upper vertical frame member 56 and the lower vertical frame member 57 at one side are connected such as to enable relative movement in the vertical direction. The upper vertical frame member 56 and the lower vertical frame member 57 at the other side are connected such as to enable relative movement in the vertical direction. This feature is described below in greater detail.

Figure 13:
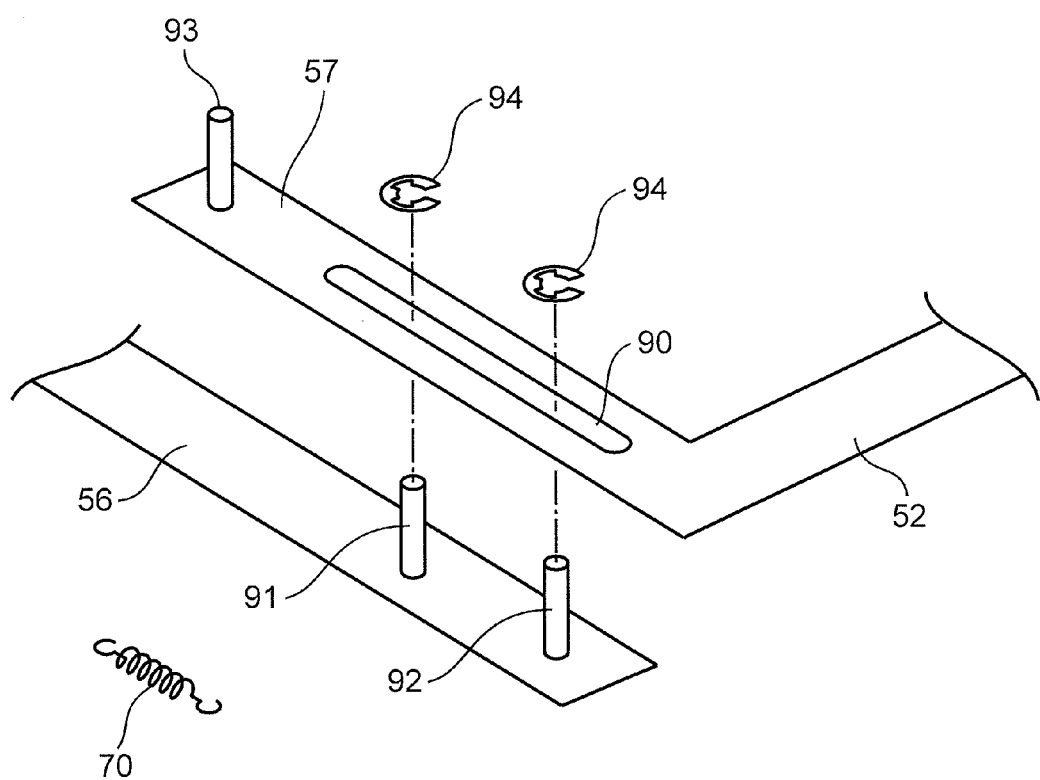
FIG. 13 is an enlarged perspective view of the connection portion of the first holding member and the second holding member.

FIG. 13 is an enlarged perspective view of the connection portion of the first holding member 51 and the second holding member 52. As shown in FIGS. 12 and 13, a slit 90 as an outer frame guide portion extending in the vertical direction is provided in the lower vertical frame member 57. A first pin 91 and a second pin 92 are fixed to the upper vertical frame member 56. The second pin 92 is provided below the first pin 91 at a distance therefrom. The first pin 91 and the second pin 92 are inserted into the slit 90. A retaining member 94 (E ring 94) is attached to each of the first pin 91 and the second pine 92. The lower vertical frame member 57 is disposed between the upper vertical frame member 56 and the retaining member 94. As a result, a connection state of the upper vertical frame member 56 and the lower vertical frame member 57 is maintained.

A third pin 93 is fixed to the lower vertical frame member 57 at a position above the slit 90 at a distance from the slit 90. The first pin 91, the second pin 92, and the third pin 93 extend in the same direction. The holding member biasing member 70 is bridged between the first pin 91 and the third pin 93. Thus, one end of the holding member biasing member 70 is attached to the first pin 91, and the other end of the holding member biasing member 70 is attached to the third pin 93. As a result, the holding member biasing member 70 can bias the first pin 91 in the vertical direction of separating the first holding member 51 and the second holding member 52 from each other. In the present embodiment, the holding member biasing member 70 is a torsion spring, but such a configuration is not limiting.

The support frame 60 forms a space S for arranging a plurality of the workpieces W at a distance from each other. The workpieces W are held by a plurality of the clampers 1 provided at the outer frames 54. A plurality of the outer frames 54 is supported by the support frame 60.

The support frame 60 is configured by assembling a plurality of frame members in a rectangular parallelepiped form, and the rectangular parallelepiped space S is formed inside the support frame 60. The space S is formed to a size corresponding to the size of the workpiece W, such as a printed circuit board, and such that a large number of the workpieces W can be arranged in the thickness direction. The upper side of the support frame 60 is open and serves as an insertion port 60a for the workpieces W.

The plurality of frame members includes a lower frame 61 assembled in a rectangular shape, side frames 63, 64 extending upward from respective four corners of the lower frame 61, and upper frames (long frames) 62 connecting upper ends of the side frame 63 and the side frame 64.

The lower frame 61 includes a pair of long frames 61a extending from the one side to the other side, and a pair of short frames 61b. One short frame 61b connects together the end portions of the long frames 61a on the one side, and the other short frame 61b connects together the end portions of the long frames 61a on the other side.

Reinforcing frames 65 connect the pair of side frames 63, and reinforcing frames 66 connect the pair of side frames 64.

The support frame 60 has a pair of upper frame support portions 81 and at least one lower frame locking portion 82. In the present embodiment, the support frame 60 has a plurality of lower frame locking portions 82. The pair of upper frame support portions 81 serves to support one end portion 51a and the other end portion 51b of the first holding member 51 extending in the horizontal direction. The lower frame locking portions 82 has a function of locking the second holding member 52 extending in the horizontal direction and preventing lateral swinging of the second holding member 52.

The pair of upper frame support portions 81 is disposed at a distance from each other in the extension direction of the first holding member 51. One upper frame support portion 81 is provided at one lateral side of the support frame 60, and the other upper frame support portion 81 is provided at the other lateral side of the support frame 60. One upper frame support portion 81 is bridged between the upper frames 62, which are long frames, at one lateral side of the support frame 60. The other upper frame support portion 81 is bridged between the upper frames 62, which are long frames, at the other lateral side of the support frame 60.

One upper frame support portion 81 is provided with a plurality of upper grooves 81a that are open at the upper side and serve for inserting one end portion 51a of the first holding member 51. The other upper frame support portion 81 is provided with a plurality of upper grooves 81a that are open at the upper side and serve for inserting the other end portion 51b of the first holding member 51.

A plurality of lower frame locking portions 82 is disposed at a distance from each other in the extension direction of the second holding member 52. Each lower frame locking portion 82 is bridged between the long frames 61a of the lower frames 61, which are long frames. Each lower frame locking portion 82 has a plurality of lower grooves 82a that are open upward and serve for inserting the second holding member 52.

As shown in FIGS. 10A and 10B, the length of the first holding member 51 is larger than the distance between the upper groove 81a of one upper frame support portion 81 and the upper groove 81a of the other upper frame support portion 81. The one end portion 51a and the other end portion 51b of the first holding member 51 project horizontally outward beyond the upper grooves 81a.

The length of the second holding member 52 is less than the distance between the upper groove 81a of one upper frame support portion 81 and the upper groove 81a of the other upper frame support portion 81. Both end portions of the second holding member 52 are positioned horizontally on the inner side with respect to the upper grooves 81a.

Figure 14:
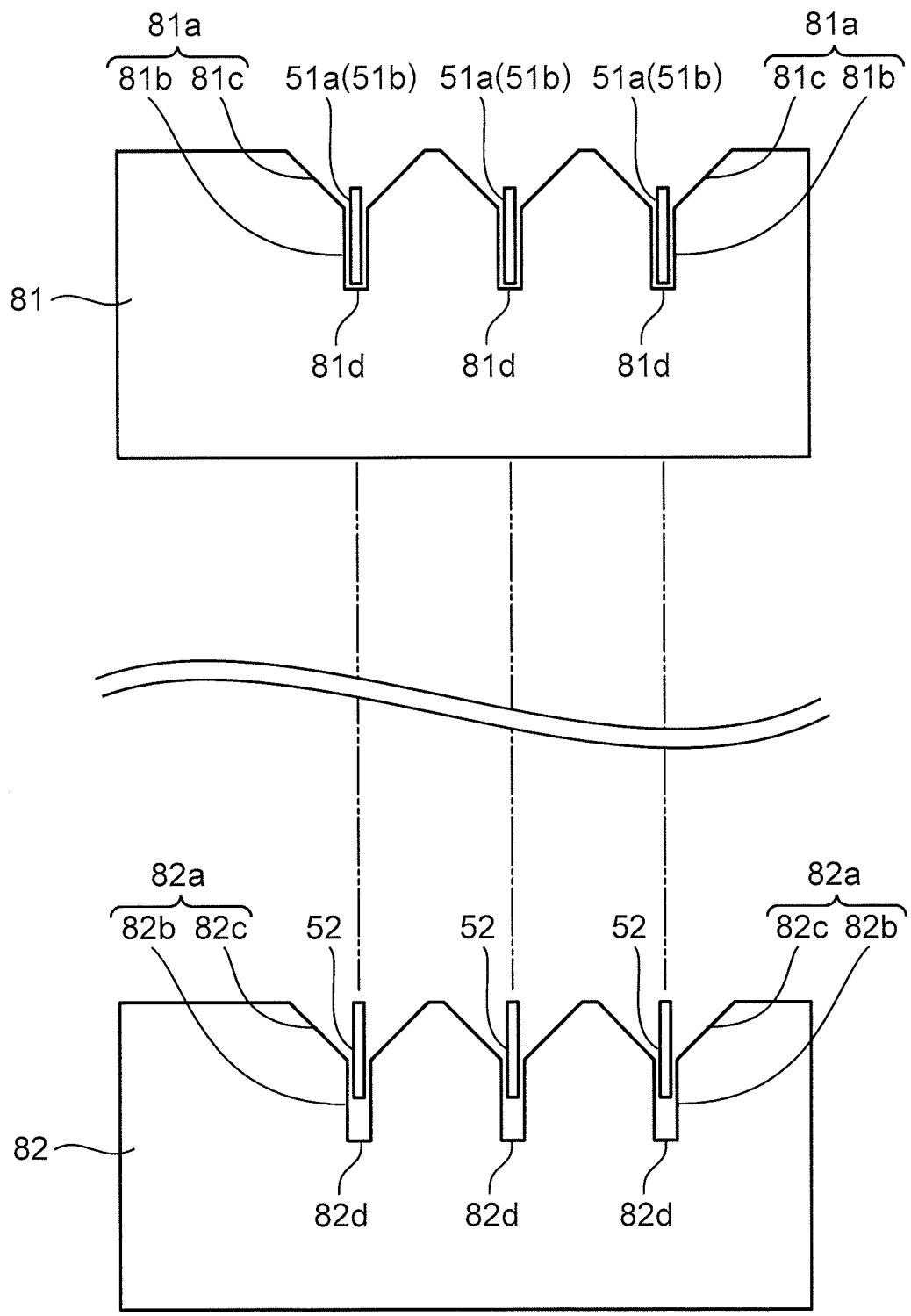
FIG. 14 is an enlarged view showing a state in which the outer frame is mounted on the support frame in the holding jig of a vertical clamp system.

FIG. 14 is an enlarged view showing the state in which the outer frame is mounted on the support frame 60 in the holding jig 102 of a vertical clamping system. As shown in FIG. 14, each upper groove 81a of the upper frame support portion 81 includes a lower portion 81b of the groove and an upper portion 81c of the groove. The lower portion 81b of the groove has a constant groove width. The upper portion 81c of the groove is connected to the upper end of the lower portion 81b of the groove, and the width of the upper portion enlarges upward. As a result, the one end portion 51a and the other end portion 51b of the first holding member 51 can be easily inserted into the upper groove 81a.

Each lower groove 82a of the lower frame locking portion 82 has a lower portion 82b of the groove and an upper portion 82c of the groove. The lower portion 82b of the groove has a constant groove width. The upper portion 82c of the groove is connected to the upper end of the lower portion 82b of the groove, and the width of the upper portion enlarges upward. As a result, the second holding member 52 can be easily inserted into the lower groove 82a.

Further, as shown in FIG. 14, when the one end portion 51a and the other end portion 51b of each of the first holding members 51 inserted into the corresponding upper grooves 81a are in contact with bottom portions 81d of the upper grooves 81a, a gap is preferably formed between the second holding member 52 inserted into the lower grooves 82a and bottom portions 82d of the bottom grooves 82a.

A plurality of the clampers 1 are held in each first holding member 51. The plurality of the clampers 1 is arranged horizontally at a distance from each other in each first holding member 51. A plurality of the clampers 1 are held in each second holding member 52. The plurality of the clampers 1 is arranged horizontally at a distance from each other in each second holding member 52. The upper edge of each workpiece W is clamped by the plurality of the clampers 1 provided at the first holding member 51, and the lower edge of the workpiece W is clamped by the plurality of the clampers 1 provided at the second holding member 52. As a result, as shown in FIGS. 10A, 10B, and 10C, a plurality of the workpieces W is stably held in the space S of the support frame 60.

A specific example of the attachment method is explained below. First, a plurality of the clampers 1 provided at the first holding member 51 is attached to the upper edge of the workpiece W. Then, when the clampers 1 are attached to the lower edge of the workpiece W, the second holding member 52 is moved in the direction of bringing the second holding member 52 closer to the workpiece W against the biasing force of the holding member biasing member 70, and in this state the plurality of the clampers 1 provided at the second holding member 52 is attached to the lower edge of the workpiece W.

In the present embodiment, the holding member biasing member 70 is provided in the lower portion of the outer frame 54, but such a configuration is not limiting. Thus, the holding member biasing member 70 may be provided in the upper portion of the outer frame 54 or in the vertically intermediate portion.

As explained hereinabove, in the first embodiment and second embodiment, in the first clamping member 10 of the clamper 1, the first contact portion 12 has the plurality of the plate spring portions 15 extending from the first base portion 11. In such a configuration, the first contact portion 12 has a structure in which the plurality of the plate spring portions 15 is branched off from the first base portion 11. Thus, the first contact portion 12 has a structure divided into a plurality of portions. Further, the plurality of the plate spring portions 15 elastically deforms independently from each other when coming into contact with the workpiece W. Therefore, the clamper 1 according to the embodiment can clamp the workpiece W in a state in which each of the plurality of plate spring portions 15 is in reliable contact with the workpiece W. As a result, the displacement of clamping position of the workpiece W and the detachment of the workpiece W from the clampers 1 can be prevented.

In the first embodiment and second embodiment, the plate spring portions 15 each include the extending portion 16 extending from the first base portion 11, and the turnback portion 17 bent at an end of the extending portion 16, and the turnback portion 17 has the contact surface 17a to be in contact with the workpiece W.

With such a configuration, since the structure is used in which the turnback portion 17 is bent with respect to the extending portion 16, the elastic deformation of the plate spring portions 15 is facilitated. Thus, the extending portion 16 can be elastically deformed with respect to the first base portion 11, and the turnback portion 17 can be elastically deformed with respect to the extending portion 16.

In the first embodiment and second embodiment, the bending angle θ of the turnback portion 17 with respect to the extending portion 16 in each plate spring portion 15 is adjusted such that the contact surface 17a is in surface contact with the workpiece W.

With such a configuration, the aforementioned surface contact makes it possible to increase the contact surface area of the first contact portion 12 and the workpiece W. Therefore, the clamping force of the clamper 1 clamping the workpiece W can be increased.

In the first embodiment, the second contact portion 12 of the second clamping member 20 has the same structure as that of the first contact portion 12 of the first clamping member 10.

With such a configuration, since the second contact portion 12 of the second clamping member 20 has the same structure as that of the first contact portion 12, even when the adhesion of foreign matter to the second contact portion 12 of the second clamping member 20, a change in the inclination of the second contact portion 12, or wear of the second contact portion 12 has occurred, the plurality of plate spring portions 15 in the second contact portion 12 elastically deform independently from each other to come into contact with the workpiece W. As a result, the effect of preventing the clamping force of the clamper 1 from decreasing can be further enhanced. This feature is described below in greater detail.

The second clamping member 20 has the second base portion 11 and the second contact portion 12, the second contact portion 12 has a plurality of the plate spring portions 15 extending from the second base portion 11, and the plurality of the plate spring portions 15 elastically deforms independently from each other to come into contact with the workpiece W. Further, each plate spring portion 15 in the second contact portion 12 includes the extending portion 16 extending from the second base portion 11, and the turnback portion 17 bent at the end of the extending portion 16, and the turnback portion 17 has the contact surface 17a to be in contact with the workpiece W. It is preferred that the bending angle of the turnback portion 17 with respect to the extending portion 16 in each plate spring portion 15 of the second contact portion 12 is adjusted such that the contact surface 17a is in surface contact with the workpiece W.

The holding jigs 101, 102 are for holding a plurality of plate-shaped workpieces W at a distance from each other. The holding jigs 101, 102 each include: a plurality of the clampers 1 described hereinabove; a plurality of the first holding members 51 each holding the clampers 1 clamping one side of the corresponding workpiece W; a plurality of the second holding members 52 each holding the clampers 1 clamping the other side of the corresponding workpiece W; the support frame 60 forming the space S for arranging a plurality of the workpieces W, which is held by the first holding members 51 and the second holding members 52, at a distance from each other; and the holding member biasing member 70 that biases at least one of the first holding members 51 and the second holding members 52 in a direction of separating the first holding members 51 and the second holding members 52 from each other.

With such a configuration, at least one of the first holding members 51 and the second holding members 52 are biased by the holding member biasing member 70 in a direction of separating the first holding members 51 and the second holding members 52 from each other. Therefore, each of the plurality of the workpieces W disposed in the space S of the support frame 60 is in the extended state at all times. Therefore, the workpieces W can be prevented from bending. Further, in a state in which the workpiece W is extended by the holding member biasing member 70, where the conventional clampers 1 having a low clamping force are used, the clamping position of the workpiece W can be easily displaced or the workpiece W can be easily detached from the clampers 1. However, since the above-described clamper 1 having the plurality of the plate spring portions 15 is used in the above-described configuration, the displacement of the clamping position of the workpiece W and the detachment of the workpiece W from the clampers 1 can be prevented. As a result, the extended state of the workpiece W can be maintained.

Where the holding jig is the holding jig 101 of a lateral side clamping system, the first holding members 51 are provided at one lateral side of the support frame 60, and the clampers 1 held by the first holding members 51 clamp one lateral side edges of the workpieces W; and the second holding members 52 are provided at the other lateral side of the support frame 60, and the clampers 1 held by the second holding members 52 clamp the other lateral side edges of the workpieces W.

In the holding jig 101 of a lateral side clamping system, the holding member biasing member 70 can apply to the workpiece W a pulling force in the lateral direction. Therefore, each of the plurality of workpieces W disposed in the space S of the support frame 60 is extended at all times. As a result, the workpieces W can be prevented from bending.

The holding jig 101 of a lateral side clamping system is provided with a plurality of fixed members 53 fixed to the support frame 60, each fixed member 53 has a guide portion 58 extending in the horizontal direction, each of the first holding members 51 is configured to be movable in the horizontal direction along the corresponding guide portion 58 relative to the corresponding fixed member 53, and the holding member biasing member 70 biases the first holding members 51 in the horizontal direction in which the first holding members 51 separate from the second holding members 52.

With such a configuration, the first holding members 51 are guided in the horizontal direction along the guide portions 58 relative to the fixed members 53. Therefore, for example, the first holding members 51 can be prevented from moving in the direction inclined from the horizontal direction with respect to the fixed members 53 and kinking the workpieces W.

In the holding jig 101 of a lateral side clamping system, the support frame 60 has an insertion port 60a for inserting the workpieces W into the space S; when the workpieces W are inserted into the space S, the support frame 60 is disposed in a posture such that the insertion port 60a is positioned above the space S; and when the plurality of the workpieces W disposed in the space S is immersed in the surface treatment liquid, the support frame 60 is disposed in a posture such that the insertion port 60a is positioned at a side of the space S and the first holding members 51 are positioned below the second holding members 52.

With such a configuration, when the workpieces W are inserted into the space S, the support frame 60 is disposed in a posture such that the insertion port 60a is positioned above the space S. Therefore, for example, the workpieces W can be inserted into the support frame 60 by moving downward the workpieces W conveyed above the holding jig 101 in the production line. Further, when the plurality of the workpieces W disposed in the space S is immersed into a plating solution, the support frame 60 is disposed in a posture such that the insertion port 60a is positioned at a side of the space S and the first holding members 51 are positioned below the second holding members 52. In such a posture, the first holding members 51 and the second holding members 52 are disposed to face each other in the vertical direction. Therefore, the force of gravity acts upon the first holding members 51 in the direction of separating the first holding members 51 from the second holding members 52. As a result, the workpieces W are further pulled in the extension direction and the extended state thereof can be easily maintained. The treatment can be conducted by immersing the workpieces W in such an extended state into the polishing solution.

Where the holding jig is the holding jig 102 of a vertical clamping system, it is preferred that the clampers 1 held by the first holding members 51 clamp the upper edges of the workpieces W, the clampers 1 held by the second holding members 52 clamp the lower edges of the workpieces W, and the first holding members 51 and the second holding members 52 constitute part of an outer frame 54 separate from the support frame 60.

In such holding jig 102 of a vertical clamping system, a force pulling the workpieces W in the vertical direction can be applied by the holding member biasing member 70. Therefore, the plurality of the workpieces W disposed in the space S of the support frame 60 is in the extended state at all times. As a result, the workpieces W can be prevented from bending. Further, in the holding jig 102 of a vertical clamping system, the first holding members 51 and the second holding members 52 are disposed to face each other in the vertical direction. Therefore, the force of gravity acts upon the first holding members 51 or the second holding members 52 in the direction of separating the first holding members 51 from the second holding members 52. As a result, the workpieces W are further pulled in the extension direction and the extended state thereof can be easily maintained. Further, with such a configuration, the plurality of the workpieces W can be held in the holding jig 102 only by inserting a plurality of the outer frames 54 in which the workpieces W have been held in advance, into the support frame 60. The plurality of the workpieces W can thus be surface treated simultaneously.

The holding jig 102 of a vertical clamping system is preferably configured to include: upper vertical frame members 56 extending downward from both sides of the first holding members 51; and lower vertical frame members 57 extending upward from both sides of the second holding members 52, wherein outer frame guide portions 90 extending in the vertical direction are provided at either of the upper vertical frame members 56 and the lower vertical frame members 57; first pins 91 that are fixed to the other of the upper vertical frame members 56 and the lower vertical frame members 57, and each of the first pin 91 is configured to move vertically relative to the corresponding outer frame guide portion 90 in a state of being engaged with the corresponding outer frame guide portion 90; and the holding member biasing member 70 biases the first pins 91 in the vertical direction in which the first holding members 51 and the second holding members 52 separate from each other.

With such a configuration, the first pins 91 are guided in the vertical direction in a state of being engaged with the outer frame guide portions 90. Therefore, for example, the upper vertical frame members 56 can be prevented from moving in the direction inclined from the vertical direction with respect to the lower vertical frame members 57 and kinking the workpieces W.

The configuration is preferred in which second pins 92 are fixed to the other of the upper vertical frame members 56 and the lower vertical frame members 57 at positions set apart in the vertical direction from the first pins 91, and each of the second pins 92 is configured to move vertically relative to the corresponding outer frame guide portion 90 in a state of being engaged with the corresponding outer frame guide portion 90.

With such a configuration, the second pins 92 are fixed at positions set apart in the vertical direction from the first pins 91, and the second pins 92 are guided in the vertical direction while being engaged with the outer frame guide portions 90. Thus, with such a configuration, not only the first pins 91, but also the second pins 92 are engaged with the outer frame guide portions 90. Therefore, when the first holding members 51 move in the vertical direction relative to the second holding members 52, the first holding members 51 or the second holding members 52 are prevented from lateral swinging, and the operation during the relative movement is stabilized.

In the holding jig 102 of a vertical clamping system, the support frame 60 preferably has a pair of upper frame support portions 81 disposed at a distance from each other in the extension direction of the first holding members 51 for supporting one end portion and the other end portion of the first holding members 51 extending in the horizontal direction; and a lower frame locking portion 82 that locks the second holding members 52 extending in the horizontal direction and suppresses lateral swinging of the second holding members 52.

With such a configuration, one end portion and the other end portion of the first holding members 51 can be supported by the pair of upper frame support portions 81, and the lower frame locking portion 82 can lock the second holding members 52 and prevent the second holding members 52 from lateral swinging.

In the holding jig 102 of a vertical clamping system, it is preferred that one of the upper frame support portions 81 have upper grooves 81a that are open upward and serve for inserting the one end portions of the first holding members 51; the other of the upper frame support portions 81 have upper grooves 81a that are open upward and serve for inserting the other end portions of the first holding members 51; and the lower frame locking portion 82 have lower grooves 82a that are open upward and serve for inserting the second holding members 52.

With such a configuration, one end portions and the other end portions of each of the first holding members 51 can be inserted into the corresponding upper grooves 81a of the upper frame support portions 81, and each of the second holding members 52 can be inserted into the corresponding lower grooves 82a of the lower frame locking portion 82 by simply lowering the first holding members 51 and the second holding members 52 downward from above the support frame 60.

In the holding jig 102 of a vertical clamping system, it is preferred that when the one end portions and the other end portions of each of the first holding members 51 inserted into the corresponding upper grooves 81a are in contact with the bottom portions of the upper grooves 81a, a gap is formed between the bottom portions of the lower grooves 82a and the second holding members 52 inserted into the lower grooves 82a.

With such a configuration, since a gap is formed between the bottom portions of the lower grooves 82a and the second holding members 52 inserted into the lower grooves 82a, the second holding members 52 are not prevented from moving in the direction of separating from the first holding members 51. Therefore, the occurrence of bending in the workpieces W can be suppressed.

In the holding jig 102 of a vertical clamping system, it is preferred that the length of the first holding member 51 be larger than the distance between the upper groove 81a of the one upper frame support portion 81 and the upper groove 81a of the other upper frame support portion 81, and the one end portion and the other end portion of the first holding member 51 project horizontally outwardly beyond the upper grooves 81a; and the length of the second holding member 52 be less than the distance between the upper groove 81a of the one upper frame support portion 81 and the upper groove 81a of the other upper frame support portion 81, and both end portions of the second holding member 52 be positioned horizontally on the inner side with respect to the upper grooves 81a.

With such a configuration, when the first holding members 51 and second holding members 52 holding the workpieces W are inserted into the space S from above the support frame 60, the downward movement of the second holding members 52 is not impeded by the pair of the upper frame support portions 81. Further, one end portions and the other end portions of each of the first holding members 51 can be inserted into the corresponding upper grooves 81a of the one upper frame support portion 81 and the upper grooves 81a of the other upper frame support portion 81 by simply lowering the first holding members 51 that project horizontally outwardly beyond the upper grooves 81a toward the space S from above the support frame 60.

The present invention is not limited to the embodiments and can be variously changed and modified without departing from the gist thereof. For example, in the embodiments, the case in which the plate spring portion 15 of the contact portion 12 in the clamper 1 includes the extending portion 16 and the turnback portion 17 is explained by way of example, but such a configuration is not limiting. For example, the turnback portion 17 of the plate spring portion 15 can be omitted. In this case, the extending portion 16 of the plate spring portion 15 is in contact with the workpiece W.

Further, the case in which the fixed member 53 of the holding jig 101 of a lateral side clamping system has a guide portion 58 extending in the horizontal direction and the first holding member 51 (movable member 51) has the engagement portion 55 is described hereinabove by way of example, but such a configuration is not limiting. Thus, the guide portion 58 and the engagement portion 55 can be omitted.

Further, the case in which the sliding movement of the upper vertical frame member 56 relative to the lower vertical frame member 57 in the holding jig 102 of a vertical clamping system is enabled by the first pin 91, second pin 92, and slit 90 is explained hereinabove by way of example, but the configuration with the sliding movement is not limiting, and other types of movement can be used.

In the holding jig 102 of a vertical clamping system which is explained hereinabove by way of example, a gap is formed between the bottom portions of the lower grooves and the second holding members 52 inserted into the lower grooves when each of the first holding members 51 inserted into the corresponding upper grooves are in contact with the bottom portions of the upper grooves, but such a configuration is not limiting. Thus, the second holding members 52 may be in contact with the bottom portion of the lower groove when the first holding member 51 inserted into the upper groves is in contact with the bottom portions of the upper grooves.

The above-described embodiments are summarized below.

The clamper according to the embodiments is provided at a holding jig used when immersing a plate-shaped workpiece into a surface treatment liquid, and clamps the workpiece. The clamper includes a first clamping member, a second clamping member, and a clamping member biasing member. The first clamping member has a first base portion and a first contact portion that is to be in contact with one surface of the workpiece. The second clamping member has a second contact portion that is to be in contact with the other surface of the workpiece. The clamping member biasing member biases at least one of the first clamping member and the second clamping member in a direction of bringing the first contact portion and the second contact portion closer to each other. The first contact portion has a plurality of plate spring portions extending from the first base portion, and the plurality of plate spring portions elastically deforms independently from each other to come into contact with the workpiece.

In such a configuration, in the first clamping member of the clamper, the first contact portion has a plurality of plate spring portions extending from the first base portion. In such a configuration, the first contact portion has a structure in which the plurality of plate spring portions is branched off from the first base portion. Thus, the first contact portion has a structure divided into a plurality of sections. The plurality of plate spring portions elastically deforms independently from each other when coming into contact with the workpiece. Therefore, the clamper according to the embodiment can clamp the workpieces in a state in which each of the plurality of plate spring portions is in reliable contact with the workpiece. As a result, the displacement of clamping position of the workpiece and the detachment of the workpiece from the clampers can be prevented. This feature is described below in greater detail.

Where a large number of clampers being used for surface treatment such as plating, foreign matter produced by solidification of components contained in the surface treatment liquid such as a plating solution can adhere to and deposit on the portions of the clampers that are in contact with the workpieces. In the clamper shown in FIGS. 3 and 4 of Japanese Utility Model Registration No. 3,153,551, the clamping portion, which is a site that is in contact with the workpieces, is not configured to be divided into a plurality of portions, as in the present embodiment. Therefore, the following inconveniences are encountered when the foreign matter is deposited on part of the clamping portion. Thus, the portion onto which the foreign matter has deposited is in contact with the workpiece, whereas the portion where the foreign matter has not deposited is not in contact with the workpiece and a gap appears therebetween. In such a case, the contact surface area of the clamper and workpiece decreases, the clamping position of the workpiece is shifted and the workpiece can easily detach from the clamper.

Further, where the clamper is used for a long time, the inclination of the first contact portion of the clamper can change or the first contact portion can be worn out. In such a case, the contact surface area of the clamper and workpiece also decreases.

Meanwhile, in the present embodiment, even if foreign matter has deposited on some of a plurality of plate spring portions, since the plurality of plate spring portions comes into contact with the workpieces as a result of independent elastic deformation, each of the plurality of plate spring portions can clamp the workpiece in a state of contact with the workpiece. As a result, the clamping force by which the clamper clamps the workpieces is prevented from decreasing and, therefore, the displacement of clamping position of the workpiece and the detachment of the workpiece from the clampers can be prevented.

It is preferred than in the clamper, each of the plate spring portions includes an extending portion extending from the first base portion, and a turnback portion bent at an end of the extending portion, and the turnback portion has a contact surface to be in contact with the workpiece.

With such a configuration, since the structure is used in which the turnback portion is bent with respect to the extending portion, the elastic deformation of the plate spring portions is facilitated. Thus, the extending portion can be elastically deformed with respect to the first base portion, and the turnback portion can be elastically deformed with respect to the extending portion.

It is preferred that the bending angle of the turnback portion with respect to the extending portion in each plate spring portion in the clamper be adjusted such that the contact surface is in surface contact with the workpiece.

With such a configuration, the aforementioned surface contact makes it possible to increase the contact surface area of the first contact portion and the workpiece. Therefore, the clamping force of the clamper clamping the workpiece can be increased.

It is preferred that the second contact portion of the second clamping member in the clamper have a same structure as that of the first contact portion of the first clamping member.

With such a configuration, since the second contact portion of the second clamping member has the same structure as that of the first contact portion, even when the adhesion of foreign matter to the second contact portion of the second clamping member, a change in the inclination of the second contact portion, or wear of the second contact portion has occurred, the plurality of the plate spring portions in the second contact portion elastically deform independently from each other to come into contact with the workpiece. As a result, the effect of preventing the clamping force of the clamper from decreasing can be further enhanced. This feature is described below in greater detail.

It is preferred that the second clamping member have a second base portion and the second contact portion, the second contact portion have a plurality of plate spring portions extending from the second base portion, and the plurality of plate spring portions elastically deform independently from each other to come into contact with the workpiece. Further, it is preferred that each plate spring portion in the second contact portion include an extending portion extending from the second base portion, and a turnback portion bent at the end of the extending portion and that the turnback portion have a contact surface to be in contact with the workpiece. It is also preferred that the bending angle of the turnback portion with respect to the extending portion in each plate spring portion of the second contact portion be adjusted such that the contact surface is in surface contact with the workpiece.

The holding jig of the present embodiment is for holding a plurality of plate-shaped workpieces at a distance from each other. The holding jig preferably includes: a plurality of the clampers described hereinabove; a plurality of first holding members, each of the first holding members holding the clampers clamping one side of the corresponding workpiece; a plurality of second holding members, each of the second holding members holding the clampers clamping the other side of the corresponding workpiece; a support frame forming a space for arranging the plurality of workpieces, which is held by the first holding members and the second holding members, at a distance from each other; and a holding member biasing member that biases at least one of the first holding members and the second holding members in a direction of separating the first holding members and the second holding members from each other.

With such a configuration, at least one of the first holding members and the second holding members are biased by the holding member biasing member in a direction of separating the first holding members and the second holding members from each other. Therefore, each of the plurality of workpieces disposed in the space of the support frame is in the extended state at all times. Therefore, the workpieces can be prevented from bending. Further, in a state in which the workpiece is extended by the holding member biasing member, where the conventional clampers having a low clamping force are used, the clamping position of the workpiece can be displaced or the workpiece can be detached from the clampers. However, since the above-described clamper having a plurality of plate spring portions is used in the above-described configuration, the displacement of the clamping position of the workpiece and the detachment of the workpiece from the clampers can be prevented. As a result, the extended state of the workpiece can be maintained.

Where the holding jig is of a lateral side clamping system, it is preferred that the first holding members be provided at one lateral side of the support frame, and the clampers held by the first holding members clamp one lateral side edges of the workpieces; and the second holding members be provided at the other lateral side of the support frame, and the clampers held by the second holding members clamp the other lateral side edges of the workpieces.

In the holding jig of a lateral side clamping system, the holding member biasing member can apply to the workpiece a pulling force in the lateral direction. Therefore, each of the plurality of workpieces disposed in the space of the support frame is extended at all times. As a result, the workpieces can be prevented from bending.

It is also preferred that the holding jig of a lateral side clamping system be further provided with a fixed member fixed to the support frame, the fixed member has a guide portion extending in the horizontal direction, the first holding members could move in a horizontal direction along the guide portion relative to the fixed member, and the holding member biasing member bias the first holding members in the horizontal direction in which the first holding members separate from the second holding members.

With such a configuration, the first holding members are guided in the horizontal direction along the guide portion relative to the fixed member. Therefore, for example, the first holding members can be prevented from moving in the direction inclined from the horizontal direction with respect to the fixed member and kinking the workpieces.

In the holding jig of a lateral side clamping system, it is preferred that the support frame have an insertion port for inserting the workpieces into the space; when the workpieces are inserted into the space, the support frame be disposed in a posture such that the insertion port is positioned above the space; and when the plurality of the workpieces disposed in the space is immersed in the surface treatment liquid, the support frame be disposed in a posture such that the insertion port is positioned at a side of the space and the first holding members are positioned below the second holding members.

With such a configuration, when the workpieces are inserted into the space, the support frame is disposed in a posture such that the insertion port is positioned above the space. Therefore, for example, the workpieces can be inserted into the support frame only by moving downward the workpieces conveyed above the holding jig in the production line. Further, when the plurality of the workpieces disposed in the space is immersed into a surface treatment liquid, the support frame is disposed in a posture such that the insertion port is positioned at a side of the space and the first holding members are positioned below the second holding members. In such a posture, the first holding members and second holding members are disposed to face each other in the vertical direction. Therefore, the force of gravity acts upon the first holding members in the direction of separating the first holding members from the second holding members. As a result, the workpieces are further pulled in the extension direction and the extended state thereof can be easily maintained. The treatment can be conducted by immersing the workpieces in such an extended state into the surface treatment liquid.

Where the holding jig is a holding jig of a vertical clamping system, it is preferred that the clampers held by the first holding members clamp upper edges of the workpieces; the clampers held by the second holding members clamp lower edges of the workpieces; and the first holding members and the second holding members constitute part of an outer frame separate from the support frame.

In such holding jig of a vertical clamping system, a force pulling the workpieces in the vertical direction can be applied by the holding member biasing member. Therefore, the plurality of the workpieces disposed in the space of the support frame is in the extended state at all times. As a result, the workpieces can be prevented from bending. Further, in the holding jig of a vertical clamping system, the first holding members and the second holding members are disposed to be side by side in the vertical direction. Therefore, the force of gravity acts upon the first holding members or the second holding members in the direction of separating the first holding members from the second holding members. As a result, the workpieces are further pulled in the extension direction and the extended state thereof can be easily maintained. Further, with such a configuration, the plurality of the workpieces can be held in the holding jig by inserting a plurality of the outer frames in which the workpieces have been held in advance into the support frame.

The holding jig of a vertical clamping system is preferably configured to include: upper vertical frame members extending downward from both sides of each of the first holding members; and lower vertical frame members extending upward from both sides of each of the second holding members, wherein outer frame guide portions extending in a vertical direction are provided at either of the upper vertical frame members and the lower vertical frame members; first pins that are fixed to the other of the upper vertical frame members and the lower vertical frame members, and each of the first pins is configured to move vertically relative to the corresponding outer frame guide portion in a state of being engaged with the corresponding outer frame guide portion; and the holding member biasing member biases the first pins in the vertical direction in which the first holding members and the second holding members separate from each other.

With such a configuration, the first pins are guided in the vertical direction in a state of being engaged with the outer frame guide portions. Therefore, for example, the upper vertical frame members can be prevented from moving in the direction inclined from the vertical direction with respect to the lower vertical frame members and kinking the workpieces.

The configuration is preferred in which second pins are fixed to the other of the upper vertical frame members and the lower vertical frame members at positions set apart in the vertical direction from the first pins, and each of the second pins is configured to move vertically relative to the corresponding outer frame guide portion in a state of being engaged with the corresponding outer frame guide portion.

With such a configuration, the second pins are fixed at positions set apart in the vertical direction from the first pins, and the second pins are guided in the vertical direction while being engaged with the outer frame guide portions. Thus, with such a configuration, not only the first pins, but also the second pins are engaged with the outer frame guide portions. Therefore, when the first holding members move in the vertical direction relative to the second holding members, the first holding members or the second holding members are prevented from lateral swinging, and the operation during the relative movement is stabilized.

In the holding jig of a vertical clamping system, the support frame preferably includes a pair of upper frame support portions disposed at a distance from each other in the extension direction of the first holding members in order to support one end portion and the other end portion of the first holding members extending in the horizontal direction; and a lower frame locking portion that locks the second holding members extending in the horizontal direction and suppresses lateral swinging of the second holding members.

With such a configuration, one end portion and the other end portion of the first holding members can be supported by the pair of upper frame support portions, and the lower frame locking portion can lock the second holding members and prevent the second holding members from lateral swinging.

In the holding jig of a vertical clamping system, it is preferred that one of the upper frame support portions have upper grooves each open upward and serving for inserting the one end portion of the corresponding first holding member; the other of the upper frame support portions have upper grooves each open upward and serving for inserting the other end portion of the corresponding first holding member; and the lower frame locking portion have lower grooves each open upward and serving for inserting the corresponding second holding member.

With such a configuration, one end portions and the other end portions of each of the first holding members can be inserted into the corresponding upper grooves of the upper frame support portions, and each of the second holding members can be inserted into the corresponding lower grooves of the lower frame locking portion by simply lowering the first holding members and second holding members downward from above the support frame.

In the holding jig of a vertical clamping system, it is preferred that when the one end portion and the other end portion of each of the first holding members inserted into the corresponding upper grooves are in contact with bottom portions of the upper grooves, a gap is formed between bottom portions of the lower grooves and the second holding members inserted into the lower grooves.

With such a configuration, a gap is formed between the bottom portions of the lower grooves and the second holding members inserted into the lower grooves. Where the second holding members are in contact with the bottom portions of the lower grooves, further downward movement of the second holding members is restricted, but with the present configuration, since a gap is formed between the bottom portions of the lower grooves and the second holding members inserted into the lower grooves, the second holding members are not prevented from moving in the direction of separating from the first holding members. Therefore, the occurrence of bending in the workpieces can be further suppressed.

In the holding jig of a vertical clamping system, it is preferred that the length of the first holding member be larger than the distance between the upper groove of the one upper frame support portion and the upper groove of the other upper frame support portion, and the one end portion and the other end portion of the first holding member project horizontally outwardly beyond the upper grooves; and the length of the second holding member be less than the distance between the upper groove of the one upper frame support portion and the upper groove of the other upper frame support portion, and both end portions of the second holding member be positioned horizontally on the inner side with respect to the upper grooves.

With such a configuration, when the first holding members and second holding members holding the workpieces are inserted into the space from above the support frame, the downward movement of the second holding members is not impeded by the pair of the upper frame support portions. Further, one end portions and the other end portions of each of the first holding members can be inserted into the corresponding upper grooves of the one upper frame support portion and the upper grooves of the other upper frame support portion by simply lowering the first holding members that project horizontally outwardly beyond the upper grooves toward the space from above the support frame.

This application is based on Japanese Patent application No. 2013-165089 filed in Japan Patent Office on Aug. 8, 2013, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A clamper that is provided at a holding jig used when immersing a plate-shaped workpiece into a surface treatment liquid, and that clamps the workpiece, the clamper comprising:
   a first clamping member having a first base portion and a first contact portion that is to be in contact with one surface of the workpiece;
   a second clamping member having a second contact portion that is to be in contact with another surface of the workpiece; and
   a clamping member biasing member configured to bias at least one of the first clamping member and the second clamping member in a direction of bringing the first contact portion and the second contact portion closer to each other, wherein
   the first contact portion has a plurality of plate spring portions extending from the first base portion, the plurality of plate spring portions configured to elastically deform independently from each other to come into contact with the workpiece,
   wherein each of the plate spring portions includes an extending portion extending from the first base portion, and a turnback portion bent at an end of the extending portion,
   wherein a bending angle of the turnback portion with respect to the extending portion is acute so that the turnback portion comes into surface contact with the workpiece, and
   wherein elastic deformation of the first contact portion makes the bending angle more acute.

2. The clamper according to claim 1, wherein the second contact portion of the second clamping member has a same structure as that of the first contact portion of the first clamping member.

3. A holding jig for holding a plurality of plate-shaped workpieces at a distance from each other, the holding jig comprising:
   a plurality of the clampers according to claim 1;
   a plurality of first holding members, each of the first holding members holding the clampers clamping one side of a corresponding workpiece;
   a plurality of second holding members, each of the second holding members holding the clampers clamping another side of the corresponding workpiece;
   a support frame forming a space for arranging the plurality of workpieces, which is held by the first holding members and the second holding members, at a distance from each other; and
   a holding member biasing member that biases at least one of the first holding members and the second holding members in a direction of separating the first holding members and the second holding members from each other.

4. The holding jig according to claim 3, wherein
   the holding jig is of a lateral side clamping system,
   the first holding members are provided at one lateral side of the support frame, and the clampers held by the first holding members clamp one lateral side edges of the workpieces, and
   the second holding members are provided at another lateral side of the support frame, and the clampers held by the second holding members clamp another lateral side edges of the workpieces.

5. The holding jig according to claim 4, further comprising:
   a fixed member fixed to the support frame, wherein
   the fixed member has a guide portion extending in a horizontal direction,
   each first holding member is configured to be movable in the horizontal direction along the guide portion relative to the fixed member, and
   the holding member biasing member biases the first holding members in the horizontal direction in which the first holding members separate from the second holding members.

6. The holding jig according to claim 4, wherein
   the support frame has an insertion port for inserting the workpieces into the space, the support frame is disposed in a posture such that the insertion port is positioned above the space, when the workpieces are inserted into the space, and the support frame is disposed in a posture such that the insertion port is positioned at a lateral side of the space and the first holding members are positioned below the second holding members, when the plurality of the workpieces disposed in the space are immersed in the surface treatment liquid.

7. The holding jig according to claim 3, wherein
the holding jig is of a vertical clamping system,
the clampers held by the first holding members clamp upper edges of the workpieces,
the clampers held by the second holding members clamp lower edges of the workpieces, and
the first holding members and the second holding members constitute part of an outer frame separate from the support frame.

8. The holding jig according to claim 7, further comprising:
upper vertical frame members extending downward from both sides of each of the first holding members; and
lower vertical frame members extending upward from both sides of each of the second holding members, wherein
outer frame guide portions extending in a vertical direction are provided at either of the upper vertical frame members and the lower vertical frame members,
first pins that are fixed to the other of the upper vertical frame members and the lower vertical frame members, and each of the first pins is configured to move vertically relative to a corresponding outer frame guide portion in a state of being engaged with the corresponding outer frame guide portion, and
the holding member biasing member biases the first pins in the vertical direction in which the first holding members and the second holding members separate from each other.

9. The holding jig according to claim 8, wherein second pins are fixed to the other of the upper vertical frame members and the lower vertical frame members at positions set apart in the vertical direction from the first pins, and each of the second pins is configured to move vertically relative to the corresponding outer frame guide portion in a state of being engaged with the corresponding outer frame guide portion.

10. The holding jig according to claim 7, wherein the support frame includes:
a pair of upper frame support portions disposed at a distance from each other in an extension direction of the first holding members in order to support one end portion and another end portion of the first holding members extending in a horizontal direction; and
a lower frame locking portion that locks the second holding members extending in the horizontal direction and suppresses lateral swinging of the second holding members.

11. The holding jig according to claim 10, wherein
one of the upper frame support portions has upper grooves each open upward and serving for inserting the one end portion of the corresponding first holding member,
the other of the upper frame support portions has upper grooves each open upward and serving for inserting the other end portion of the corresponding first holding member, and
the lower frame locking portion has lower grooves each open upward and serving for inserting the corresponding second holding member.

12. The holding jig according to claim 11, wherein a gap is formed between bottom portions of the lower grooves and the second holding members inserted into the lower grooves, when the one end portion and the other end portion of each of the first holding members inserted into the corresponding upper grooves are in contact with bottom portions of the upper grooves.

13. The holding jig according to claim 11, wherein
a length of the first holding members is larger than a distance between the upper groove of the one upper frame support portion and the upper groove of the other upper frame support portion, and the one end portion and the other end portion of the first holding members project horizontally outwardly beyond the upper groove of the one upper frame support portion and the upper groove of the other upper frame support portion, and
a length of the second holding member is less than the distance between the upper groove of the one upper frame support portion and the upper groove of the other upper frame support portion, and both end portions of the second holding member are positioned horizontally on an inner side with respect to the upper groove of the one upper frame support portion and the upper groove of the other upper frame support portion.

* * * * *